US008350252B2

(12) United States Patent
Gao

(10) Patent No.: US 8,350,252 B2
(45) Date of Patent: Jan. 8, 2013

(54) BOUNDARY-MODULATED NANOPARTICLE JUNCTIONS AND A METHOD FOR MANUFACTURE THEREOF

(75) Inventor: Pu-Xian Gao, Vernon Rockville, CT (US)

(73) Assignee: University of Connecticut, Farmington, CA (US)

( * ) Notice: Subject to any disclaimer, the term of this patent is extended or adjusted under 35 U.S.C. 154(b) by 872 days.

(21) Appl. No.: 12/404,036

(22) Filed: Mar. 13, 2009

(65) Prior Publication Data

US 2011/0180783 A1    Jul. 28, 2011

Related U.S. Application Data

(60) Provisional application No. 61/069,427, filed on Mar. 14, 2008.

(51) Int. Cl.
*H01L 29/66* (2006.01)
(52) U.S. Cl. .............. 257/15; 257/E21.04; 257/E29.168
(58) Field of Classification Search ...................... 257/15
See application file for complete search history.

(56) References Cited

U.S. PATENT DOCUMENTS

| | | | | |
|---|---|---|---|---|
| 5,234,641 | A * | 8/1993 | Rutt .............................. | 264/617 |
| 2009/0233426 | A1 * | 9/2009 | Poplavskyy et al. .......... | 438/502 |
| 2010/0264403 | A1 * | 10/2010 | Sirringhaus et al. ............ | 257/24 |

OTHER PUBLICATIONS

Gao, Pu Xian, et al. "Conversion of Zinc Oxide Nanobelts into Superlattice-Structured Nanohelices," Science, 309: 1700-1704 (Sep. 9, 2005).

Gao, et al., "Bridged ZnO Nanowires Across Trenched Electrodes," *Applied Physics Letters*, 91: 142108 (Oct. 3, 2007).
Gao, et al., "Multicolored ZnO Nanowire Architectures on Trenched Silicon Substrates," *J. Phys. Chem. C*, 111: 13763-13769 (Aug. 24, 2007).
Gao, et al., "Nanowire Piezoelectric Nanogenerators on Plastic Substrates as Flexible Power Sources for Nanodevices," *Adv. Mater*, 19: 67-72 (2007) (Published online Dec. 12, 2006).
Gao, et al., "Three-Dimensional Interconnected Nanowire Networks of ZnO," *Chemical Physics Letters*, 408: 174-178 (May 5, 2005).
Huey, et al., "Nanoscale Variation in Electric Potential at Oxide Bicrystal and Polycrystal Interfaces," *Solid State Ionics*, 131: 51-60 (Jul. 10, 2000).
Lin, et al., "Buffer-Facilitated Epitaxial Growth of ZnO Nanowire," *Crystal Growth & Design*, 5(2): 579-583 (2005) (Published online Oct. 26, 2004).
Oba, et al., "Current-Voltage Characteristics of Cobalt-Doped Inversion Boundaries in Zinc Oxide Bicrystals," *J. Am. Ceram. Soc.*, 86(9): 1616-1618 (2003) (Published online Dec. 20, 2004).
Sato, et al., "Atomic Structures and Electrical Properties of ZnO Grain Boundaries," *J. Am. Ceram. Soc.*, 90(2): 337-357 (Jan. 26, 2007).

(Continued)

*Primary Examiner* — Mamadou Diallo
(74) *Attorney, Agent, or Firm* — Hamilton, Brook, Smith & Reynolds, P.C.

(57) ABSTRACT

A method of providing miniaturized size down to nanoscale electronic materials, which may be easily incorporated into the future ever-scaling down power electronics, microelectronics and nanoelectronics device systems, is disclosed. A linear or nonlinear nanoparticle (nanowire) junction design that allows precise controllability over an electronic device (e.g., a varistor) performance, which is typically difficult for the traditional sintered bulk varistor, is also disclosed. A localized doping and chemical modulation, across junctions allows flexible and tunable design over the nanoscale grain boundary band engineering is further disclosed. Furthermore, a method of operating memory, using electrostatic potential modulated coding and decoding across periodic nanoparticle grain boundary linearly, is also disclosed.

12 Claims, 21 Drawing Sheets

OTHER PUBLICATIONS

Sato, et al., "Dopant-Segregation-Controlled ZnO Single-Grain-Boundary Varistors," *Applied Physics Letters*, 86: 152112 (Apr. 7, 2005).

Wang, et al., "Field Emission Properties of Zinc Oxide Nanowires Fabricated by Thermal Evaporation," *Physics E.*, 36: 86-91 (2007) (Published online Oct. 6, 2006).

Xing, et al, "Synthesis and Electrical Properties of ZnO Nanowires," *Micron*, 37: 370-373 (2006) (Published online Nov. 16, 2005).

Yoon, et al., "Role of Grain Boundaries in ZnO Nanowire Field-Effect Transistors," *Journal of Applied Physics*, 101: 024301 (Jan. 16, 2007).

\* cited by examiner

BOUNDARY-MODULATED NANOPARTICLE JUNCTIONS AND A METHOD FOR MANUFACTURE THEREOF

RELATED APPLICATION

This application claims the benefit of U.S. Provisional Application No. 61/069,427, filed on Mar. 14, 2008. The entire teachings of the above application are incorporated herein by reference.

BACKGROUND

Currently, bulk polycrystalline varistors are generally used for high voltage circuit protection, while low voltage and ultra-low voltage protection has been a less-touched area without a true analogue product to the high voltage surge arrestor. The general processing methods of prior art varistors typically involve bulk approaches, for example, a polycrystalline sintering process. Such bulk processing does not allow for precise controllability of the various fabrication steps. Furthermore, prior art varistors also lack controllability during operation. Currently, the operating points (e.g., breakdown voltage) of varistors are not capable of being modulated.

SUMMARY

In example embodiments described herein, a miniaturized and nanoscale varistor is fabricated by using a novel and sequential two-step or multi-step rational synthesis strategy. The varistor may include linear or nonlinear nanoparticle (or nanowire) junctions. The junctions may be formed with rational local boundary chemical modulation. These modulations may employ a controllable varistor design, unlike the average bulk sintering process having to involve an incontrollable interconnected grain boundary segregation of impurities. A large tunable range of breakdown voltages and an index of nonlinearity may be designed and fabricated using example procedures described herein in a manner allowing a single device to meet the requirements of high power electronics, low-voltage microelectronics, and nanoelectronics.

In example embodiments a semiconductor or functional oxide device comprising multiple nanoparticles including a tuned number of grain boundaries, and a junction including the multiple nanoparticles defining a tunable electric potential of the junction is disclosed. The multiple nanoparticles may be arranged in an ordered, random, or semi-random manner. The nanoparticles are fabricated via a hydrothermal or solvothermal synthesis and a greater number of grain boundaries may result in a larger breakdown voltage of the junction. The junction may be a linear or nonlinear junction including homogenous grain boundaries, or a heterojunction. The comprised grains in the junction could be of an orientation relationship in a random, semi-random or periodic manner between each other.

The electric potential may be a back-to-back Schottky potential barrier. The tunable electric potential may be achieved by introducing localized impurities into the grain boundaries. The localized impurities may be introduced by way of impregnation and/or an atomic force microscope. The electric potential may be tuned by an external electric field, an external magnetic field, an external temperature field, or/and an external stress field.

Tuning the number of grain boundaries may vary at least one fabrication parameter non-uniformly during fabrication. The at least one fabrication parameter may be pressure, and/or temperature, and/or external fields such as magnetic field and electrical field.

The device may be a varistor, or a memory unit, as well as other electronic components. The device may be configured for low power surge protection. The device may also be tunable for both high power and low power applications.

It should further be appreciated that at least a subset of the nanoparticles may include nanohelix structures. The nanohelix structures may provide an electrical tuning by providing anisotropic surface potentials across a pure (i.e., non-doped) grain boundary. The nanohelix structures may also be tuned with the use of an induced piezoelectric effect.

BRIEF DESCRIPTION OF THE DRAWINGS

FIG. 20D is an SEM image of the nanohelix superlattice whose data are illustrated in FIGS. 21A and 21B.

Figure 1:
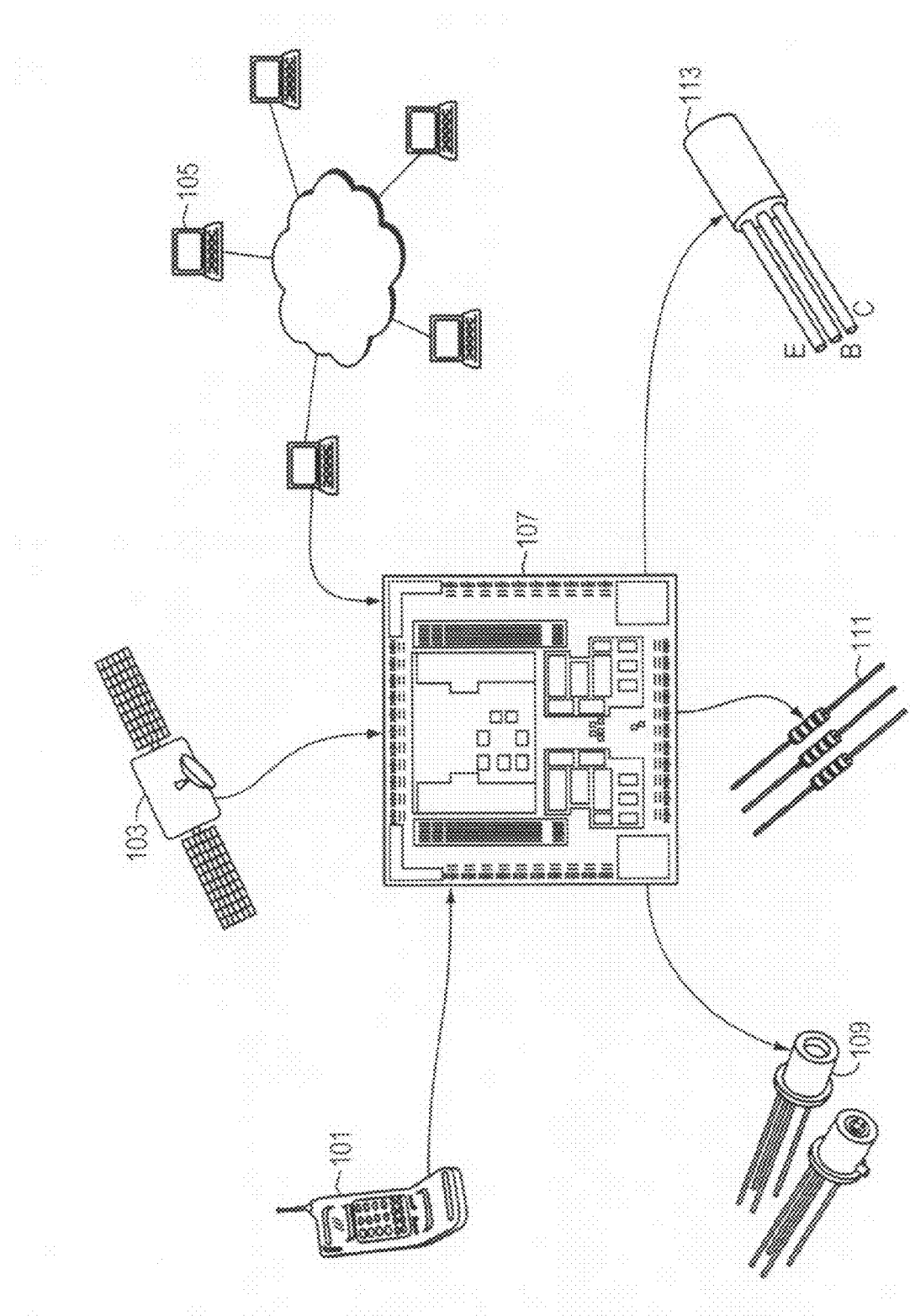
FIG. 1 is a schematic of electronic devices and electronic components that may benefit from the use of example embodiments.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating example embodiments.

DETAILED DESCRIPTION

A description of example embodiments follows.
System Overview

The break-through concept of semiconductor superlattice heterostructures, first proposed by Esaki and Tsu in the 1970's, can be described as the controlled construction of a nanoscale periodic potential modulation by a designed combination of different materials. Traditional semiconductor or functional oxide superlattices periodically modulate the electronic potential either by composition variation or by a dopant induced electrical field effect.

Such an artificial layering of multi-phase or doped semiconductors or functional oxides has engineered a variety of functional materials with novel optical and transport properties, leading to a variety of electronic and optoelectronic applications. These electronic and optoelectronic applications may include resonant tunneling devices, lasers, photodiodes, and photodetectors. The thickness of an individual superlattice layer is generally between a few angstroms to a few hundreds of angstroms, comparable to lattice parameters of materials.

FIG. 1 illustrates a number of electronic devices such as a cellular phone 101, a satellite system 103, and a communications network 105. All of the illustrated devices typically utilize integrated circuit chips 107. These integrated circuit chips 107 may include a number of semiconductor or functional devices, such as photodetectors 109, resistors 111, and transistors 113.

Of particular interest to materials scientists is the interplay between superlattice nanoscale/atomic junction (interface) structures of various semiconductor or functional oxide devices and their corresponding physical properties. As device structures shrink to nano or even atomic scale, unique quantum effects occur in the physical and chemical properties of the device as a result of discrete band structures. Concurrently, nanoscale surfaces and interfaces play a significant role in determining the properties of materials.

Figure 2B:
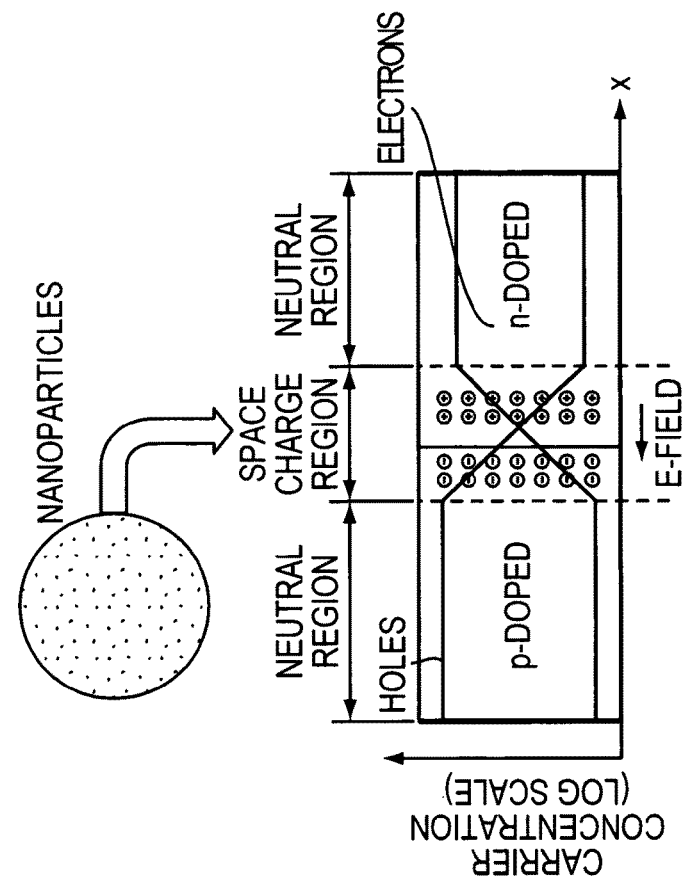
FIG. 2B is a schematic of a semiconductor or functional oxide junction including an implantation of nanoparticles.
Figure 2A:
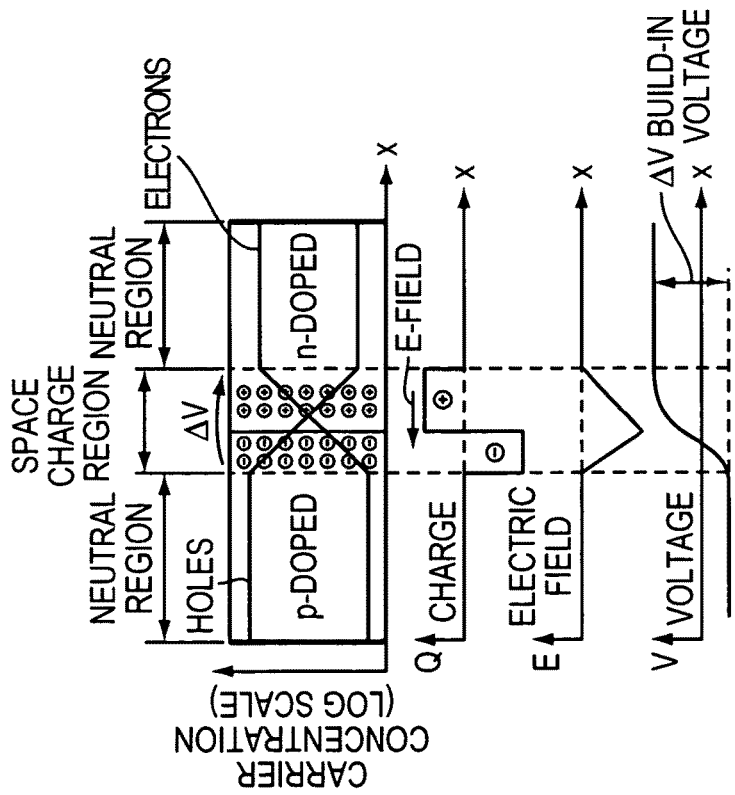
FIG. 2A is a schematic of a semiconductor or functional oxide junction.

FIG. 2A illustrates a typical semiconductor or functional oxide junction and plots charge density, electronic field, and voltage of the junction. In example embodiments, an analogue design to the periodical structures is utilized. Specifically, a modulated nanoparticle (nanowire) linear or nonlinear junction structure may be utilized as miniaturized varistors, memories, sensors, and/or other known electronic components, with potential applications in power electronics, microelectronics, and nanoelectronics.

FIG. 2B illustrates a semiconductor or functional oxide junction indicating where the modulated nanoparticle may be introduced.

Figure 3:
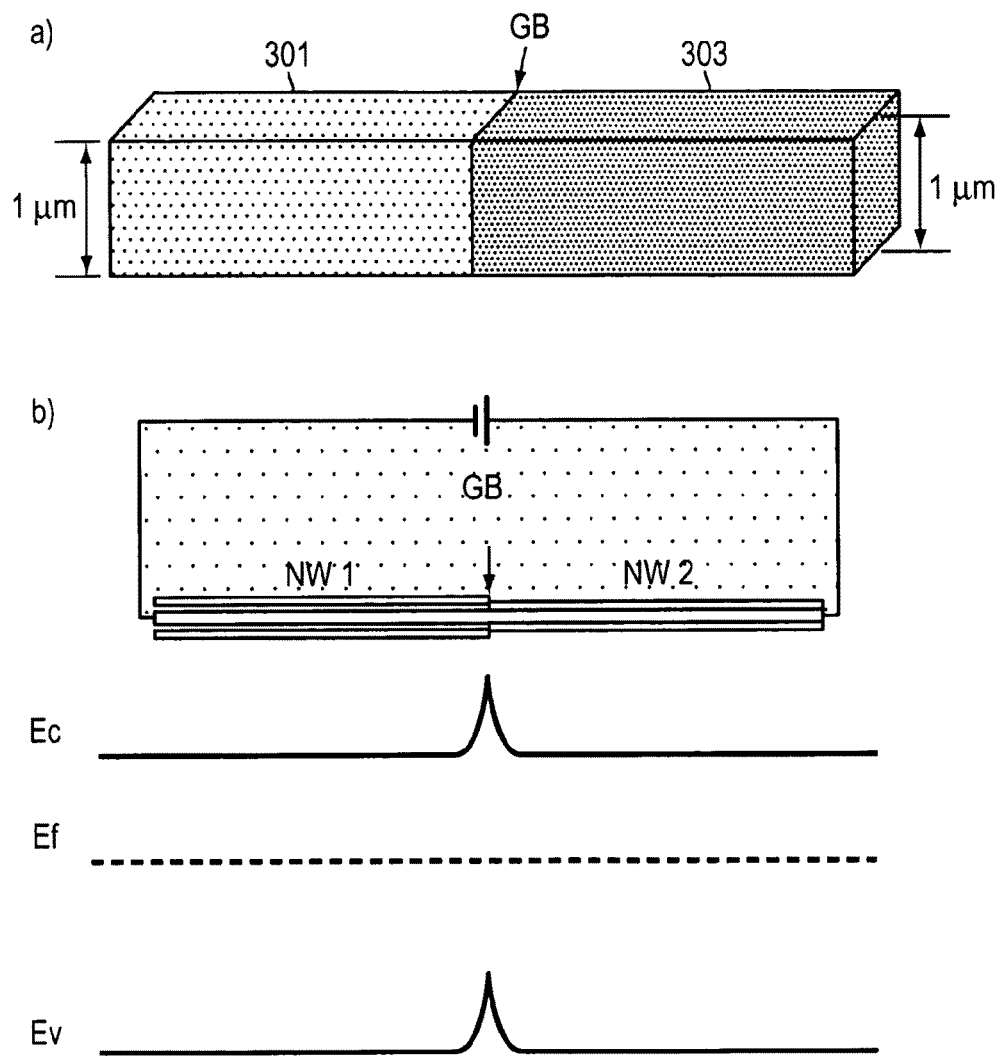
FIG. 3 is a diagram of a single grain-boundary homogeneous nanoparticle and corresponding band structure.

FIG. 3 illustrates a linear element of a single grain-boundary homogeneous nanoparticle junction formed by the connection of two nanowires (a), and the expected band structure of the formed junction (b). The linear element (or nanoparticle) is composed of two nanowires (or nanorods) 301 and 303 sharing a middle grain boundary (GB). The diameters of homogenous nanowires may be comparable with a range of 1 nm to 1000 nm, and the length may be tens of nanometers to the micron scale. The cross-section may be of any shape depending on the crystallography of the materials. For example, for zinc oxide (ZnO), the nanowire cross-section may be rectangle or hexagonal, etc.

The formed junction (b) shows the expected grain boundary band structure line-up between the homogeneous nanoparticle junctions. A back-to-back Schottcky potential barrier may be built across the grain boundary. To realize this, two kinds of approaches can be used. One is to build a second phase layer in-between the homogeneous boundaries, and the other is to build an impurity diffusion layer in the junction area.

To design and engineer junction interfaces and grain boundaries, a linear or nonlinear periodic linear junction array made of nanoparticles (that may include any number of nanowires) may be used to modulate the electrostatic potentials across the junctional interfaces. The nanoparticles may be obtained with the use of a novel hydrothermal or solvothermal synthesis process, where deionized water or other organic solvents such as ethanol can be used, described below, that results in nanoparticles including a tunable number of grain boundaries. In order to precisely tune the characteristics of the semiconductor or functional oxide device junction, localized doping may be utilized. In example embodiments, localized doping may be achieved with an impregnation process or a localized dip pen atomic force microscope (AFM).

Hydrothermal or Solvothermal Synthesis:

Photonic crystals of regularly spaced nanobuilding blocks, such as nanoparticles, nanowires, and nanobeams, can offer unique optical properties and therefore have promising applications in nanolasers, nanophotonics, and quantum computing. A number of techniques have been used for the fabrication of three-dimensional (3D) photonic crystals including silicon micromachining, holographic lithography, self-assembly, glancing-angle deposition, auto-cloning, and biotemplate replication. However, for these techniques, major drawbacks include the postprocessed polycrystalline structure, high processing cost, and low defect controllability. It is a challenge to fabricate single crystalline 3D nanophotonic crystals at low-cost, large scale, and high efficiency.

In example embodiments, by combining a nanoimprinting lithography (NIL) technique and low-temperature chemical synthesis approach, a new method has been developed for fabricating large scale 3D ordered nanowire architectures. As an example, the basis of Si microtrenches with a two-dimensional (2D) cross-sectional profile may be used to tailor the growth of 3D ZnO single grain boundary nanowire architectures using a low-temperature hydrothermal or solvothermal synthesis. Optically, 3D nanowire architectures exhibit unique multicolored nanodiffraction effects distinct from the 2D nanowire arrays on flat Si surface. In combination with this low-temperature synthesis technique, well-defined 3D substrates produced using NIL can be used to engineer well-oriented 3D nanowire architectures as potential multicolored nanodisplays, nanophotonic interconnects, and nanowaveguides.

Figure 4:
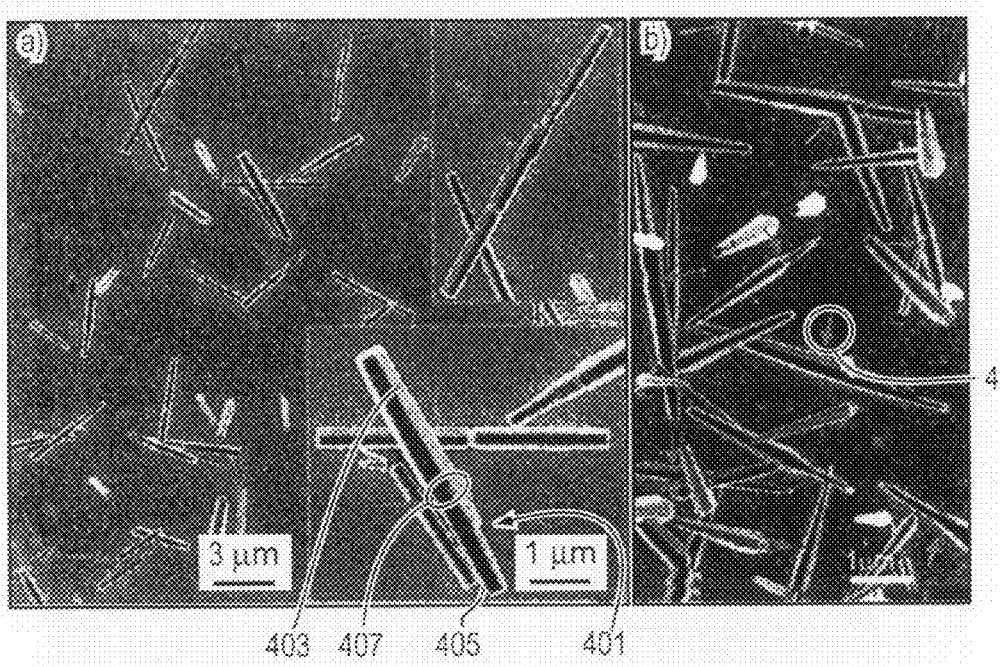
FIG. 4 is an illustration of linear nanoparticles including grain boundaries fabricated using hydrothermal synthesis.

FIG. 4 illustrates a number of linear nanoparticles, including a tunable number of grain boundaries fabricated using a novel hydrothermal or solvothermal synthesis method. Nanoparticles featuring a single grain boundary (GB) formed by the interconnection of two nanowires, for example ZnO nanowires. Nanoparticle 401 includes two nanowires 403 and 405 with a grain boundary 407 defined in the intersection of the two nanowires. Other grain boundaries in FIG. 4 are identified by arrows 409.

The diameter of the nanoparticles can be in the range of 10-1000 nm, and the length can be in the range of 50 nm to tens of microns, depending on the synthesis parameters. The synthesis parameters may include a solution concentration, a substrate condition, and temperature and pressure fractuations. The temperature and pressure fractuations may involve a non-uniform tuning, or adjustment, of the temperature and pressure throughout the cycle of the hydrothermal or solvothermal synthesis. By varying the synthesis parameters, the number of grain boundaries included in the nanoparticles may be precisely tuned according to desired junction characteristics. As the number of gain boundaries of the particles in a junction increases, the breakdown voltage associated with the junction may also increase.

As an example, the growth of ZnO nanowires may be conducted by suspending the Au or ZnO seeds modified substrates in a Pyrex glass bottle filled with an equal molar aqueous solution of zinc nitrate hexahydrate ($Zn(NO_3)_2 \cdot 6H_2O$, 0.01 M) and hexamethylenetetramine ($C_6H_{12}N_4$, 0.01 M) at 80° C. The reaction time for such a solution may typically be 2-18 hours for both substrates coated with Au or layers with ZnO seeds. After reaction, the substrates may be removed from the solution, rinsed with deionized water, and dried in air at 80° C. overnight. The structure and morphology of ZnO nanowires may be characterized by scanning electron microscopy (SEM, LEO 1530 and 1550 FEG at 5 and 10 kV) and transmission electron microscopy (TEM, Hitachi HF-2000 at 200 kV). A Nikon Eclipse L150 optical microscope attached with a charge-coupled device (CCD) camera together with an image processing computer may be used for optical imaging at magnifications of 100×, 200×, 500×, and 1000×. Reflection spectroscopy may be conducted on a Beckman DU640 UV-vis-NIR spectrophotometer with wavelength coverage of 200-1100 nm.

Figure 5:
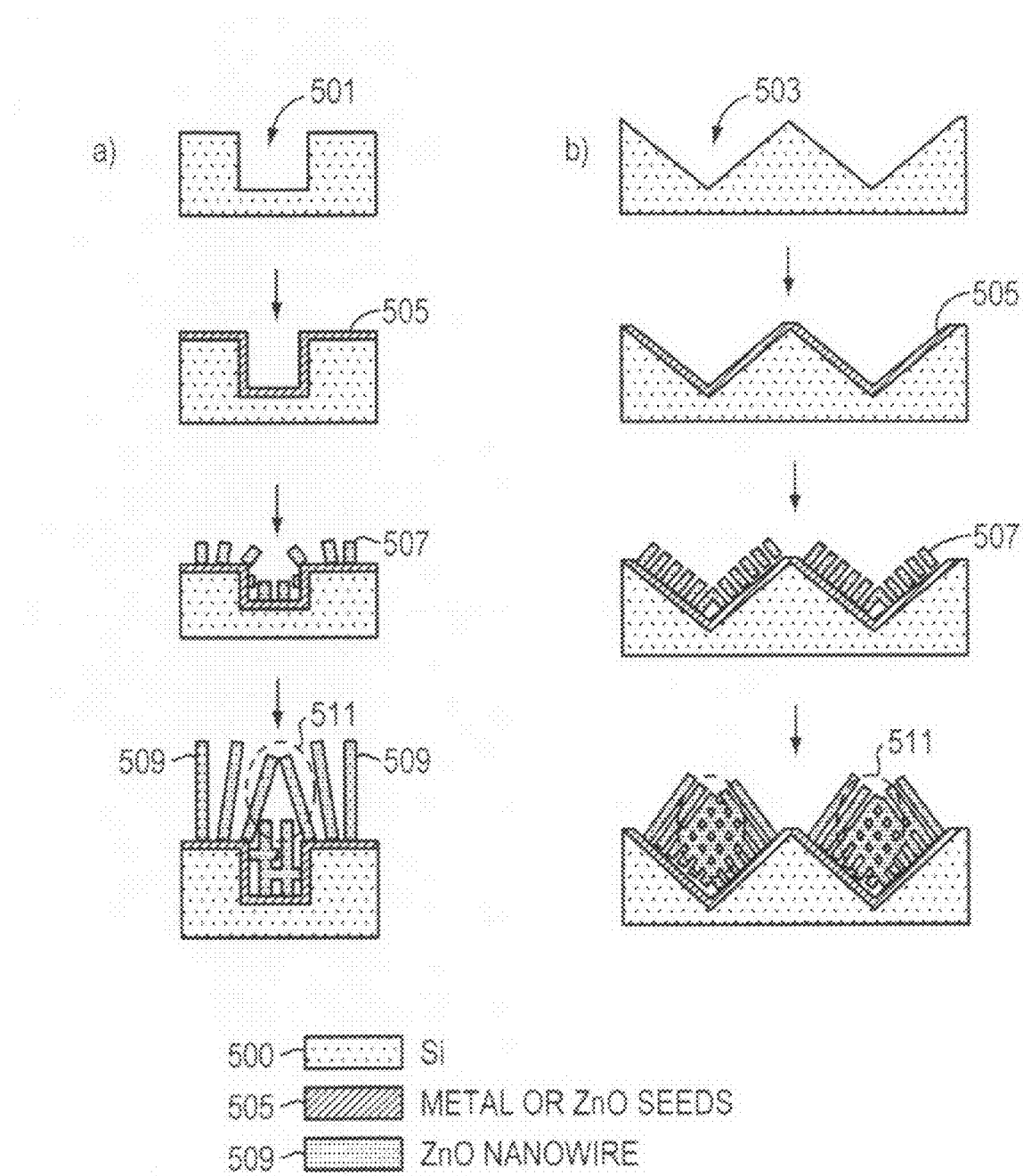
FIG. 5 is a schematic of a fabrication process for 3D nanowire architectures.

FIG. 5 is a schematic diagram illustrating the fabrication process of 3D nanowire architectures. As an example, two microtrench geometries embedded in silicon (Si) 500 defined by NIL (Nanonex NX-2000) may be used. One is a rectangular-shaped trench 501, and the other is a triangular-shaped trench 503 (row (a)). Both microtrench arrays may have the same periodicity of ~1 μm.

Before nanowire growth, the Si substrates 500 including the two types of microtrenches 501 and 503 may undergo a deposition process. The deposition process may involve a 50 nm thick layer of Au or ZnO seeds 505 deposited on the surfaces of the Si substrates 500 by magnetron sputtering (row (b)).

As the growth proceeds, ZnO nanowires 507 may be controlled by the template of either the Au layer or the ZnO seed layer to promote growth normal to the local substrate surface (row (c)). In this way, a 3D nanowire architecture can be achieved by virtue of alternating two orientations normal to each other (e.g., as shown in the triangular-shaped trench embodiment 503) or with certain angles depending on the 2D cross-sectional profile (e.g., as shown in the rectangular-shaped trench embodiment 501) of the microtrenches.

It should be appreciated that because of the space limitation for the nanowires, when nanowires grow beyond a certain density, the nanowires may tend to compromise and grow vertically, instead of conforming to growth normal to the substrate surface (e.g., nanowires 509 of row (d)). Furthermore, it is also be appreciated that an intersection phenomena may occur as the growth continues, as indicated in the dotted elliptical regions 511.

Figure 6:
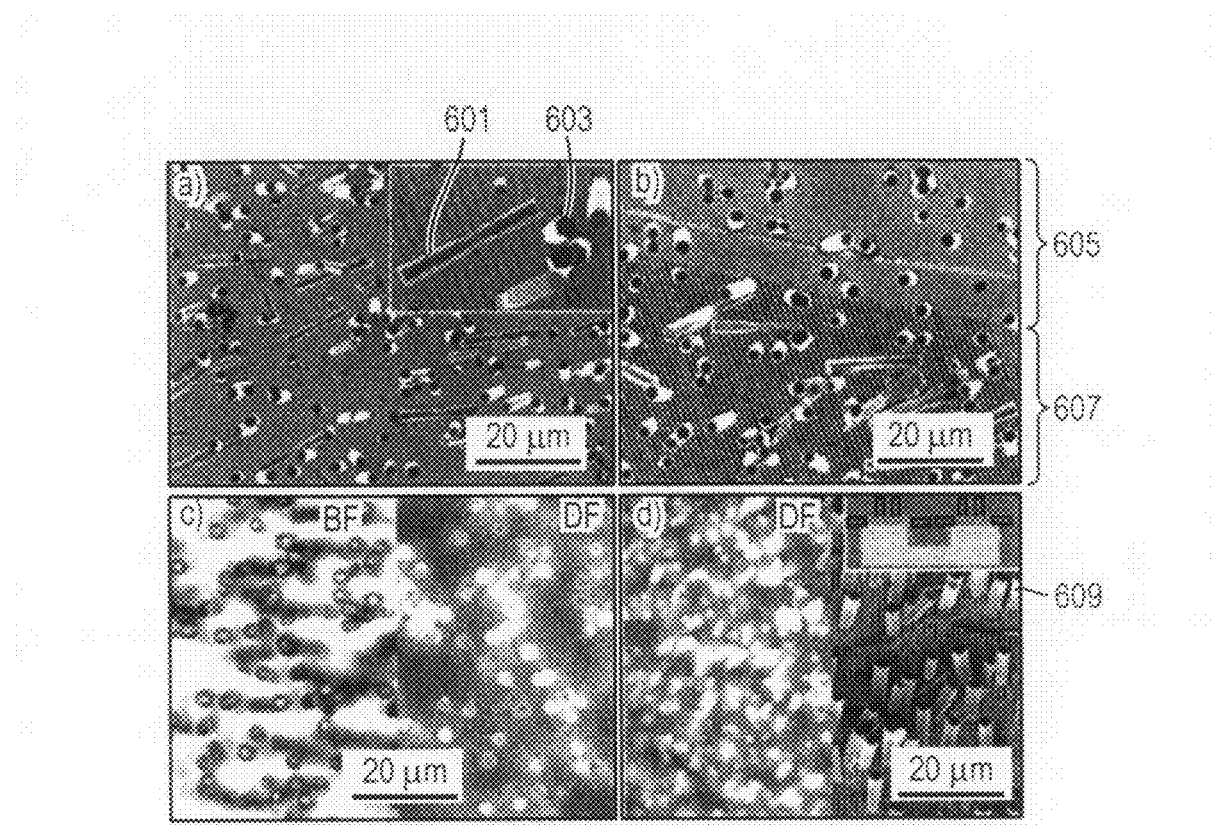
FIGS. 6A and 6B are scanning electron microscopy (SEM) images displaying the morphology of nanowires grown on a rectangular-shaped trenched silicon (Si) substrate coated with gold (Au)
FIGS. 6C and 6D are optical micrographs displaying the morphology of nanowires grown on a rectangular-shaped trenched Si substrate coated with Au.

FIGS. 6A and 6B illustrate plan view SEM images of the typical morphology of nanowires grown on a rectangular-shaped microtrench Si substrate coated with Au. As shown, the nanowires grew sparsely but not in a periodic way and were tailored by the microtrench geometry to grow along one of two primary orientations. One orientation may be horizontal and parallel to the microtrench bottom surface and normal to the trench length (e.g., nanowires 601) as indicated in the inset picture of FIG. 6A. The other orientation may be vertical and parallel to the sidewalk of microtrenches and normal to the trench length (e.g., nanowires 603).

The hexagonal top surfaces of vertical nanowires suggested the growth direction of ZnO nanowires may be along the c axis of wurtzite ZnO. Each individual horizontal nanowire generally has a uniform dumbbell structure, as indicated by arrowheads in FIGS. 6A and 6B.

FIG. 6B illustrates the nanowire growth around the boundary between the flat Si surface and the microtrenched surface of the substrates. On the flat Si surface (top part of FIG. 6B, 605), the growth result may include a 2D vertical array of nanowires. Because of the existence of rectangular-shaped microtrenchs, a 3D nanowire architecture may be formed by an alternation of two orientations conforming to the 2D rectangle cross-sectional profile is seen in the bottom part of FIG. 6B, 607.

FIG. 6C illustrates a typical optical micrographs in a dark field (DF, right) and a bright field (BF, left) at 500× that are focused on the top surfaces of the vertical nanowire array. The dark field optical micrograph revealed a substantially uniform shadow of the horizontal nanowire array is shown in the form of dark-green lines, while the vertical nanowire array was recorded as dark-blue circle patterns with the incident light beam normal to the top surfaces. The bright field optical micrograph instead revealed a bright dotted pattern for vertical nanowire arrays, which may be due to the large angle reflection from their mirrored top hexagonal surfaces.

FIG. 6D illustrates a set of side-view optical (left) and SEM (right) images that show a 3D architecture including the vertical nanowire arrays and horizontal nanowire arrays, as illustrated in the inset 609.

Figure 7:
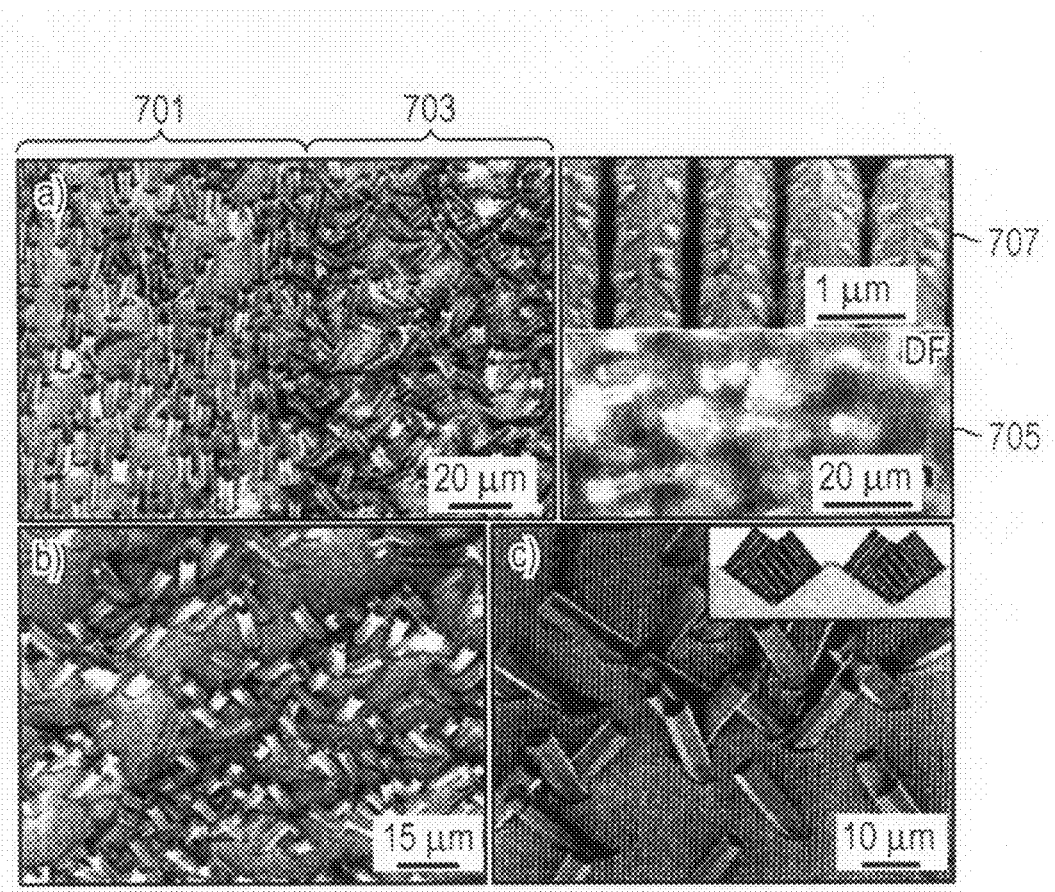
FIGS. 7A and 7B are SEM images displaying the morphology of nanowires grown on a triangular-shape trenched Si substrate coated with Au.
FIGS. 7C and 7D are optical micrographs displaying the morphology of nanowires grown on a triangular-shape trenched Si substrate coated with Au.

FIGS. 7A-7C illustrate the results of growth on the triangular-shaped microtrench Si substrate coated with Au. The growth of nanowires of the triangular-shaped microtrench also conformed to the cross-sectional profile of the NIL-defined microtrench patterns.

FIG. 7A is a side view of the grown 3D nanowire architectures. On the left-hand side 701 of FIG. 7A, a vertically aligned nanowire array was grown on the flat Si surface; on the right-hand side 703, a 3D nanowire architecture is presented with ZnO nanowires growing along two alternate directions defined by the triangle cross-sectional profile.

The bottom right inset of FIG. 7A illustrates a top view optical micrograph 705. The top view optical micrograph 705 appears blurred because of the tilted side walls and hence inclined nanowires with respect to the incident light beam.

FIGS. 7B and 7C illustrate magnified tilted view SEM images which show the 3D nanowire architectures with defined alternating orientations but without a notable periodicity due to the sparse distribution of nanowires. Despite a size distribution of nanowires in the range of 1.5-3 μm (FIG. 7C) that is larger than the periodicity of the microtrench of 1 μm (top right inset of FIG. 7A, 707), the triangle microtrench profile still defines the two alternating growth orientations of the nanowire array.

To inherit the periodicity of the microtrenches, a layer of sputtered ZnO seeds may be used instead of an Au coating as an alternate template for ZnO nanowire growth. When the Au layer was replaced with a layer of ZnO seeds, the 3D nanowire architectures grew much denser under the same growth conditions, and the nanowires are much thinner.

Figure 8:
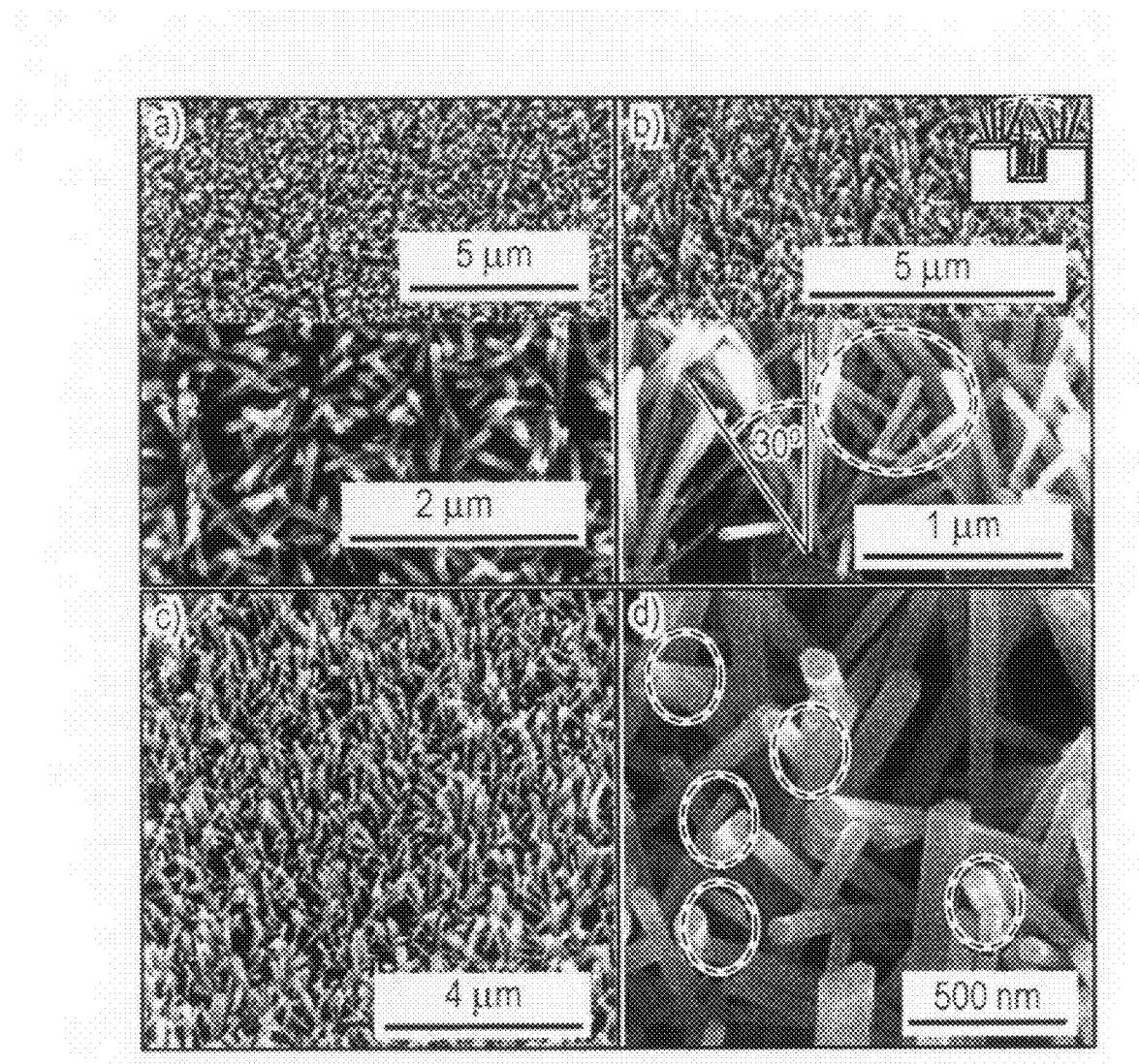
FIGS. 8A and 8B are SEM images of as-grown nanowires on rectangular-shape trenches coated with 50 nm of ZnO seeds without postannealing.
FIGS. 8C and 8D are SEM images of as-grown nanowires on rectangular-shape trenches coated with 50 nm of ZnO seeds with postannealing.

FIGS. 8A and 8B illustrate a top-view and side-view, respectively, of SEM images of the as-grown nanowires on rectangular-shaped microtrenches coated with 50 nm of ZnO seeds without a postanneal processing. The periodicity of the microtrench array has been inherited after the growth, where the 3D nanowire array exhibited the same periodicity of ~1 μm. The intersection phenomena become frequent as nanowire lengths are of a uniform ~2 μm, twice the periodicity. The nanowires have a diameter of ~80 nm. The circled region in FIG. 8B represents an area with significant intersection of nanowires with different orientations. FIG. 8B further provides a tilted view that illustrates the periodicity of the 3D nanowires architecture from the top surface to the bottom of the microtrenches. The densely packed nanowires have an inclined orientation distribution ranging from 0° to 90° with respect to the normal direction of the top surface of the substrate, while the majority of the nanowire orientations are 0-30°, which might be due to the fact that the trenched areas are relatively localized and their geometry might limit access of solution reactants to establish nanowire growth locations.

FIGS. 8C and 8D are top-view and side-view, respectively, SEM images of nanowires grown on rectangular-shaped microtrench substrate coated with ZnO seeds and annealed. Despite a similar size distribution as the nanowires grown using unannealed ZnO seeds, this tailored nanowire architecture has to some extent lost the periodicity of the underlying Si microtrenches. The lost preferred crystal orientations for ZnO seeds after annealing might contribute to the loss of periodicity of nanowire architectures. A more random orientation distribution of seeds might have led to more frequent intersection events, as indicated b the dotted circle regions. Interconnecting junction regions have formed in these areas when two or more nanowires met each other.

Figure 9:
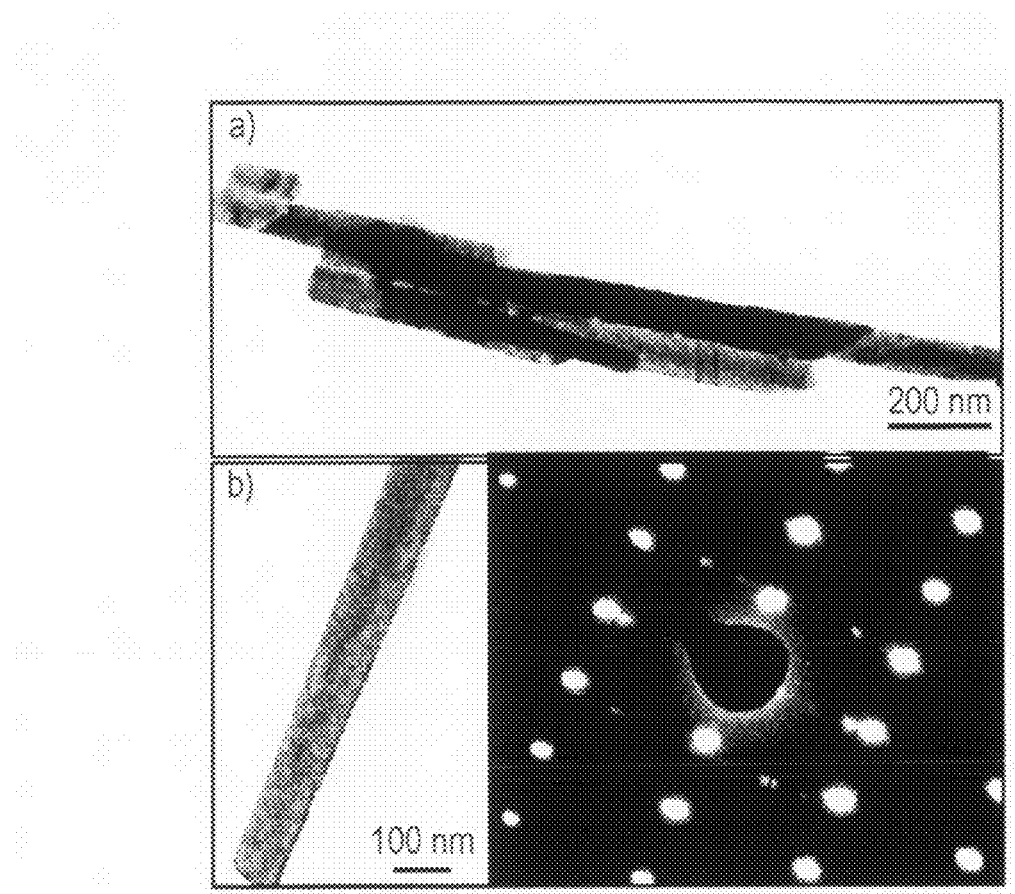
FIGS. 9A and 9B are SEM images of a low magnification transmission electron microscopy (TEM) and an electron diffraction pattern corresponding to an individual ZnO nanowire, respectively.

FIG. 9A illustrates a typical low magnification TEM image. To determine the crystallinity and structure of the as-grown nanowires, TEM characterization may be conducted. The diameter of each nanowire is ~80 nm, and the length is ~1.5-3 μm. Each nanowire was a single crystal with very good crystallinity and grew along [0001] enclosed by {0110} faceted side surfaces, as revealed by the electron diffraction pattern shown in FIG. 9B.

From the above structure and morphology characterization results, it seems as though the 3D nanowire architectures can inherit the underlying 3D microtrench surface profiles by controlling the growth directions of the nanowires using Au or ZnO seed layers. When the density and nanowire diameter are controlled to fit into the dimensions of the periodic microtrench arrays, the periodicity of microtrench pattern can be inherited as well.

Figure 10:
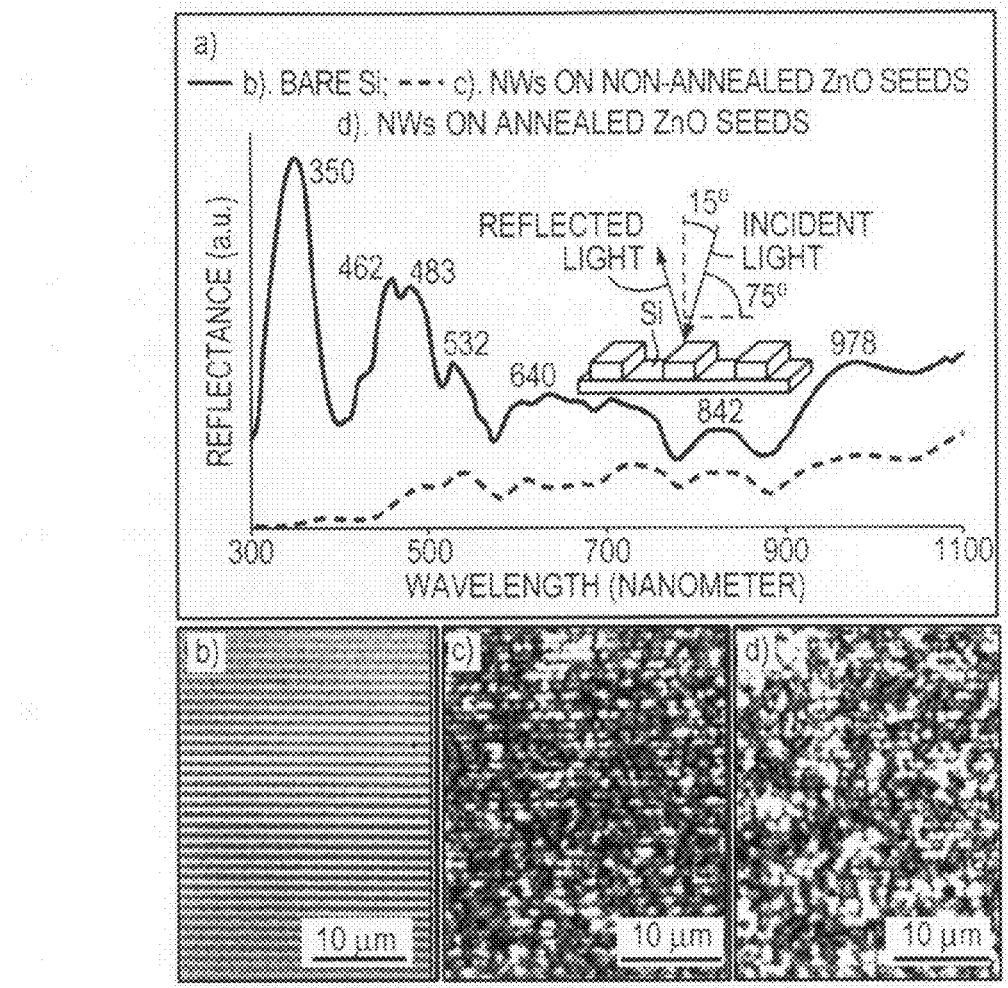
FIG. 10A is graphical depiction of a collected reflectance spectra from three types of rectangular-shaped trench samples.
FIGS. 10B-10D are optical micrographs corresponding to a bare Si substrate.

Optically, periodicity and orientation modulation may be two keys for realizing specific photonic functions such as light trapping and guiding. To find out if the inherited periodicity and orientation alternation from microtrench substrates have any optical characteristics in these tailored 3D ZnO nanowire architectures, angular reflection measurements were performed on three samples for comparison. The three samples were respectively bare Si with rectangular-shaped microtrenches, 3D ZnO nanowires on a rectangular-shaped microtrenched substrate coated with unannealed ZnO seeds, and 3D ZnO nanowires on a rectangular-shaped microtrenched substrate that was coated with ZnO seeds and annealed at 400° C. The experiments were conducted in a wavelength range from UV (300 nm) to visible (400-800 nm) and near-infrared (800-1100 nm) to reveal a full range of light interaction with the 3D nanowire architectures, Si, and relevant nearby air cavities. To achieve maximum interaction between the incident light and the substrates, the reflectance was measured at 15° with respect to the normal direction of the flat Si substrate surface, with the incident light beam normal to the trench lines, as illustrated in the inset of FIG. 10A. Therefore, the incident light was propagating along a major nanowire axis direction and strongly interacting with the periodic 3D nanowire architecture.

FIG. 10A further illustrates the collected reflectance spectra. For comparison purposes, the reflectance spectrum of the bare silicon substrate is presented as a dark blue line, which revealed large reflections in the whole experimental wavelength range. This may explain why the background of the optical image in FIG. 10B appeared white. The relatively stronger reflection happened in the light blue (462 and 483 nm) and UV (350 nm) range, leading to slightly tinted cyan and violet colors on the white background. As a comparison, the ZnO nanowire samples appear to have a strong ability to absorb the UV range wavelength including 350 nm, as evidenced by UV range spectra (300-390 nm) with negligible reflectance in FIG. 10A. In the infrared wavelength region, despite some absorption, the reflectance peaks and valleys repeated for the ZnO nanowires on the unannealed. Si substrate. It is suggested that at infrared wavelengths, the light can still propagate along the surface of Si substrate within a ~2 μm thick top layer of ZnO nanowires, through the transparent ZnO nanowire single crystals without too much absorption and diffusive scattering loss. Compared with the unannealed sample, the annealed sample has shown much more significant absorption over the full wavelength range. The reason for this phenomenon might be due to the larger random orientation of the nanowires (FIGS. 8C and 8D) compared with the unannealed sample (FIGS. 8A and 8B). As a result, the randomly oriented ZnO nanowires increase the extent of diffusive scattering and absorption, therefore reducing the overall reflectance.

There is a color difference between the two ZnO nanowire samples when they are observed with the naked eye. For ZnO nanowires grown on unannealed ZnO seed/Si substrates, the sample looks colorful when viewed from different angles, while the sample with an annealed. ZnO seed/Si substrate appeared white without any other specific colors when viewed from different angles. Undoubtedly, the diffusive scattering over the whole wavelength range is likely due to the random orientations of the nanowires despite the existence of the local orientation ordering (FIG. 10D, optical image at 1000×). Under the reflectance optical microscope, different local reflectance wavelengths can be resolved.

FIGS. 10C and 10D illustrate two optical micrographs corresponding to the unannealed and annealed samples, respectively. The two local regions exhibited different color distributions. FIG. 10C includes a greater number of ordered 3D nanowire architectures as compared to FIG. 10D, and also includes a greater uniform and colorful reflectance including red, orange, green, cyan, blue, and violet. Conversely, the randomly oriented 3D nanowire architectures includes diffusive scattering leading to fewer distinct color displays with red, yellow, blue, and violet, and more unresolved white regions.

To reveal the correlation of color domains with the tailored 3D nanowire architectures, more detailed optical characterization has been conducted. A comparison of optical micrographs in correlation with the electron micrographs covering the same size area of ZnO nanowire architectures was performed.

Figure 11:
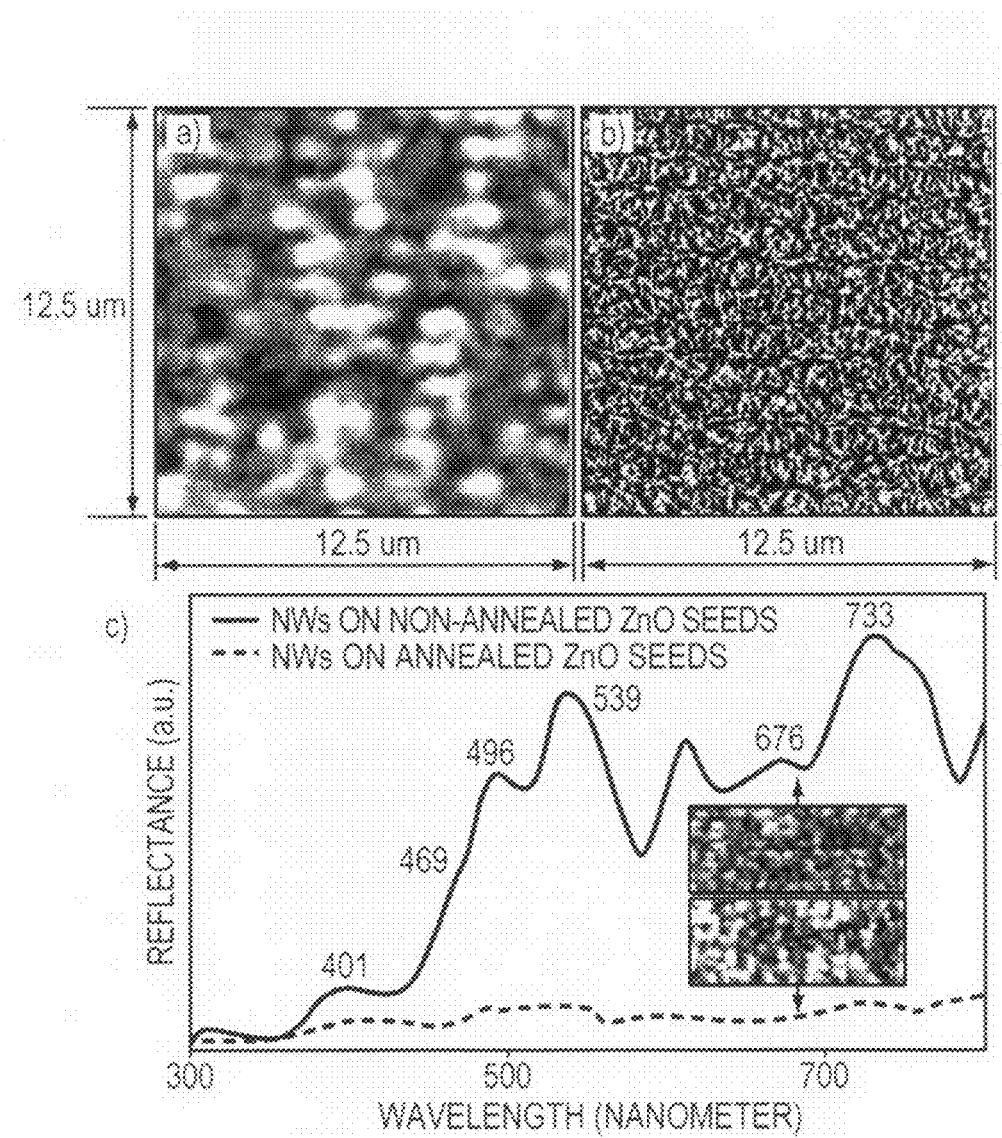
FIGS. 11A and 11B are optical and an electron micrographs, respectively, corresponding to an area of 12.5 μm×12.5 μm from a nanowire architecture.
FIG. 11C is an illustrative comparison of a reflectance spectrum in a visible wavelength range between a non-annealed sample and an annealed sample.

FIGS. 11A and 11B illustrate a pair of optical and electron micrographs corresponding to an area of optical and electronic micrographs corresponding to an area of 12.5 μm×12.5 μm on the unannealed sample. The resolved color domains in FIG. 10A cover all of the primary colors including red, orange, yellow, green, cyan, blue, and violet in the visible wavelength range (380-740 μm). As shown by the labeled peaks in FIG. 11C for the unannealed sample, the reflectance peaks covered all of the primary colors except yellow. Each domain color is a bit diffused instead of completely uniform, suggesting a certain narrow orientation distribution for the nanowires including one color domain. This is consistent with the SEM imaging results in FIGS. 8A and 8B, where the orientations of the nanowires range from 0° to 90° to the direction normal to the substrate top surface, with the majority of the nanowires oriented around 15° (FIG. 8B).

Overall, the color domain shape is non-uniform in FIG. 11A, but still features a periodicity of 1 μm similar to the tailored 3D nanowire architecture of FIG. 11B. Although the domain shape can be circular, square, rectangular, or any other geometrical shape, the domain width may generally be in the range of 300-500 nm. In the current example, since the two strongest reflectance peaks for the unannealed sample are 733 and 539 nm (FIG. 11C), which are in the red range (625-740 nm) and green range (500-565 nm), respectively, red and green color domains are the major color domains for the results illustrated in FIG. 11A. Compared with the unannealed sample, the annealed sample exhibited a very low reflectance spectrum, with one relatively significant peak at 401 nm, in the violet wavelength range. As discussed previously, frequent diffusive scattering and absorption of full range spectrum on the sample have led to a white appearance at a larger scale. As shown in the inset bottom optical micrograph, the background domain colors on a microscopic scale were red, yellow, green, violet, and white.

From the above discussions, a layer of ordered 3D ZnO nanowire architectures may engineer the white Si substrate under reflected light into a periodic multicolored map comprised of periodic color domains. It is suggested that the periodicity of color domains and color uniformity can be precisely engineered by tuning the periodicity of 3D substrates as well as the orientation distribution of nanowire growth. It should be appreciated that the 3D surface profiles of the substrates, as well as more directed design and synthesis of nanowire architectures with desired dimensions, separations, and orientations, specifically sized, localized, shaped, and colored nanodomains can be achieved through the tuning of processing parameters.

Figure 12:
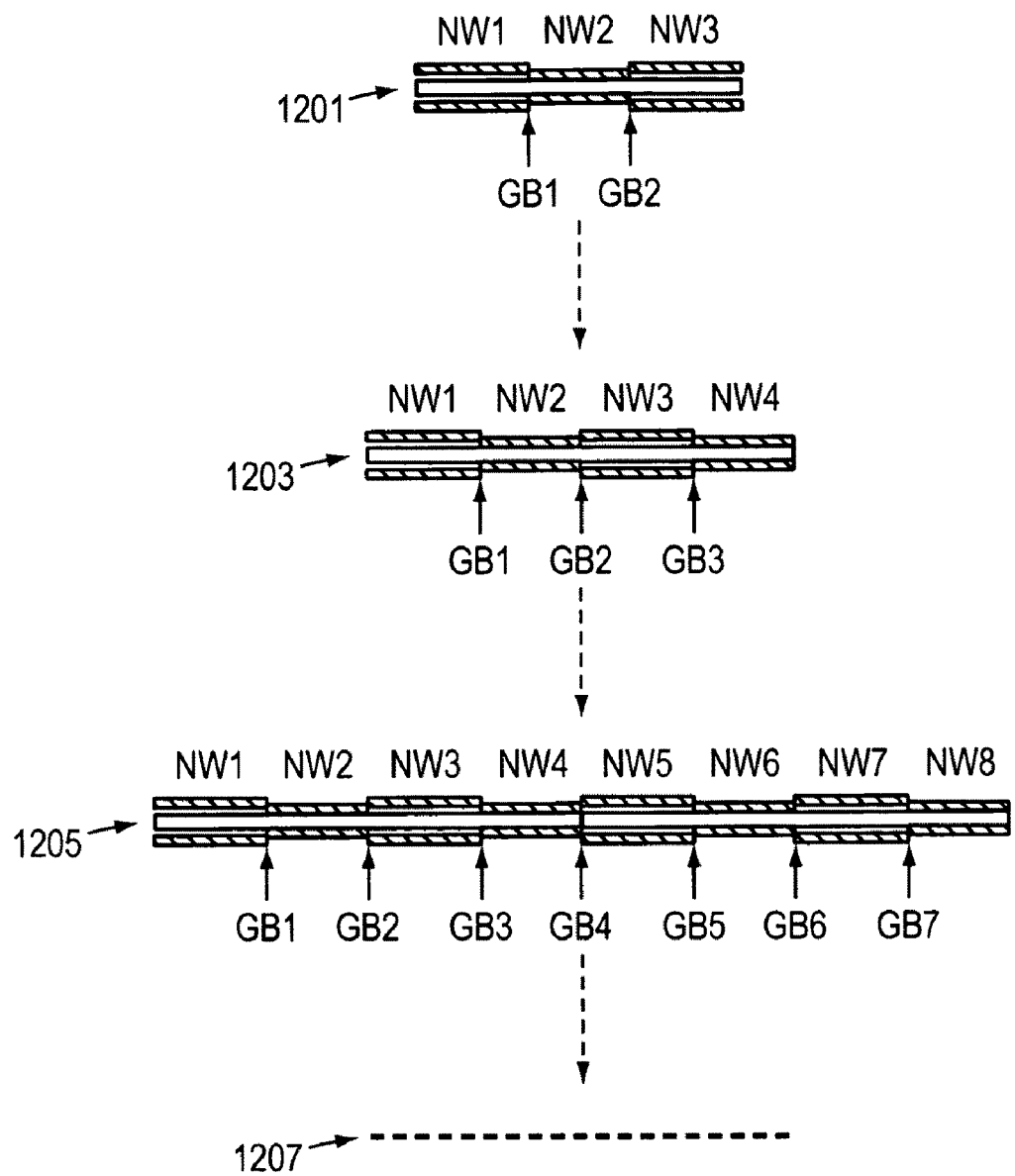
FIG. 12 is a schematic of the evolution of multigrain boundary linear junction arrays.

As an example, FIG. 12 illustrates the evolution from a 2-GB junction array 1201 to a 3-GB array 1203, a 7-GB array 1205, and to an even greater number GB junction array 1207 achieved through a tuning of processing parameters. The 2-GB junction array 1201 may include three nanowires NW1-NW3 with grain boundaries GB1 and GB2 defining the interconnections of the three nanowires. The 3-GB junction array 1203 may include four nanowires NW1-NW4 with grain boundaries GB1-GB3 defining the interconnections of the four nanowires. The 7-GB junction array 1205 may include eight nanowires NW1-NW8 with grain boundaries GB1-GB7 defining the interconnections of the eight nanowires. Similarly, a nanoparticle featuring a greater numbered GB junction array may also include a great number of nanowires with the various grain boundaries defining the interconnections of the nanowires.

Localized Doping:

Once fabricated, the nanoparticles may be placed in the semiconductor or functional oxide device junction. With the use of impurities, the characteristics of the semiconductor or functional oxide device may be tuned. It should be appreciated that the nanoparticle grain boundaries may inherently include impurities as a result of the hydrothermal or solvothermal synthesis.

Figure 13:
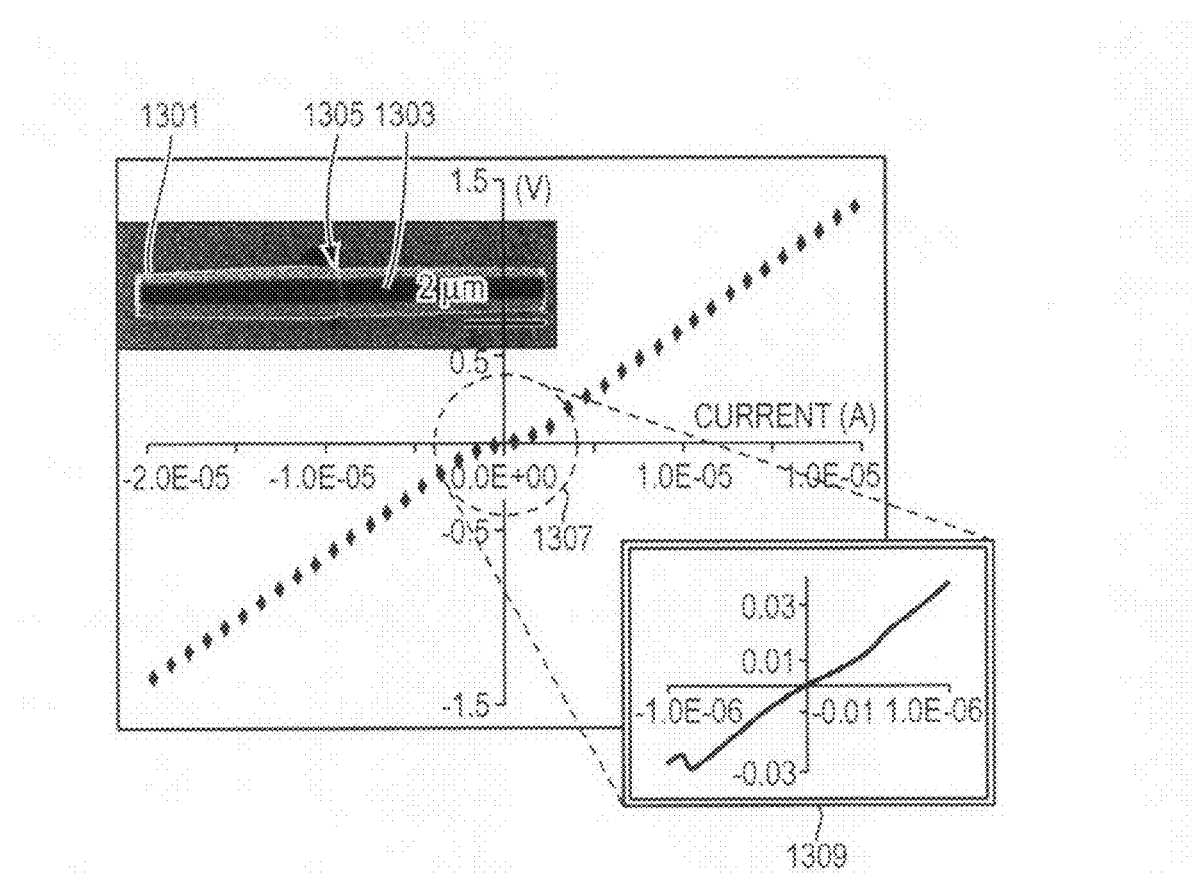
FIG. 13 is a graphical result of non-linear current-voltage characteristics applied across a twin nanowire junction with a single grain boundary.

FIG. 13 illustrates a typical electrical measurement conducted on a hydrothermally grown nanowires 1301 and 1303 with a single grain boundary 1305 forming a nanoparticle. The I-V characteristics were found to be nonlinear as the dotted circle 1307 illustrates and described in the bottom right inset 1309. The nonlinearity indicates the existence of grain boundary impurities, which may form electrostatic potential barriers, leading to the nonlinear I-V characteristics.

While the nanoparticles obtained via the hydrothermal or solvothermal synthesis already include impurities, to achieve greater control over the characteristics of the junction localized doping of individual grain boundaries may be employed.

Research applications in biomedical science and technology usually require various portable, wearable, easy-to-use, and/or implantable devices that can interface with biological systems. Organic or hybrid organic-inorganic microelectronics and nanoelectronics have long been a possibility. However, these devices require a power source, such as electrochemical cells or piezoelectric, thermoelectric, and pyroelectric transducers, to generate or store the electrical energy created through chemical, mechanical, or thermal processes. Finding a suitable power source has remained a major challenge for many devices in bioengineering and medical fields.

ZnO is a typical piezoelectric and pyroelectric inorganic semiconducting material used for electromechanical and thermoelectrical energy conversion. Nanostructures of ZnO, such as nanowires, nanobelts, nanotubes, nanorings, nanosprings, and nanohelices, have attracted extensive research interest because of their potential applications as nanoscale sensors and actuators. While most of the current applications focus on its semiconducting properties, only a few efforts have utilized the nanometerscale piezoelectric properties of ZnO. In an example embodiment, using ZnO nanowire arrays grown on a single-crystal sapphire substrate, mechanical energy may be converted into electrical energy at the nanoscale. A conductive atomic force microscopy (AFM) tip may be used in contact mode to deflect the aligned nanowires. The coupling of piezoelectric and semiconducting properties in ZnO may create a strain field and charge separation across the nanowires as a result of their bending. The rectifying characteristic of the Schottky barrier formed between the metal tip and the nanowire may lead to electrical current generation.

The ceramic and semiconducting substrates used for growing ZnO nanowires may be hard and brittle and are not typically used in applications that require a foldable or flexible power source, such as implantable biosensors. By using ZnO nanowire arrays grown on a flexible plastic substrate, a flexible power source may be built on conducting-polymer films. This approach has many advantages, two of these advantages being: (1) use of a cost-effective, large-scale, wet-chemistry strategy to grow ZnO nanowire arrays at temperatures lower than 80° C.; and (2) the growth of aligned ZnO nanowire arrays can occur on a large assortment of flexible plastic substrates. The latter advantage could play an important role in the flexible and portable electronics industry. Various dimensions, shapes, and orientations of ZnO nanowires and microwires on flexible plastic substrates may be capable of producing piezoelectric voltage output, giving a real advantage for energy harvesting using large-scale ZnO nanowire arrays. The voltage generated from a single nanowire can be as high as 50 mV, which is large enough to power many nanoscale devices.

Figure 14:
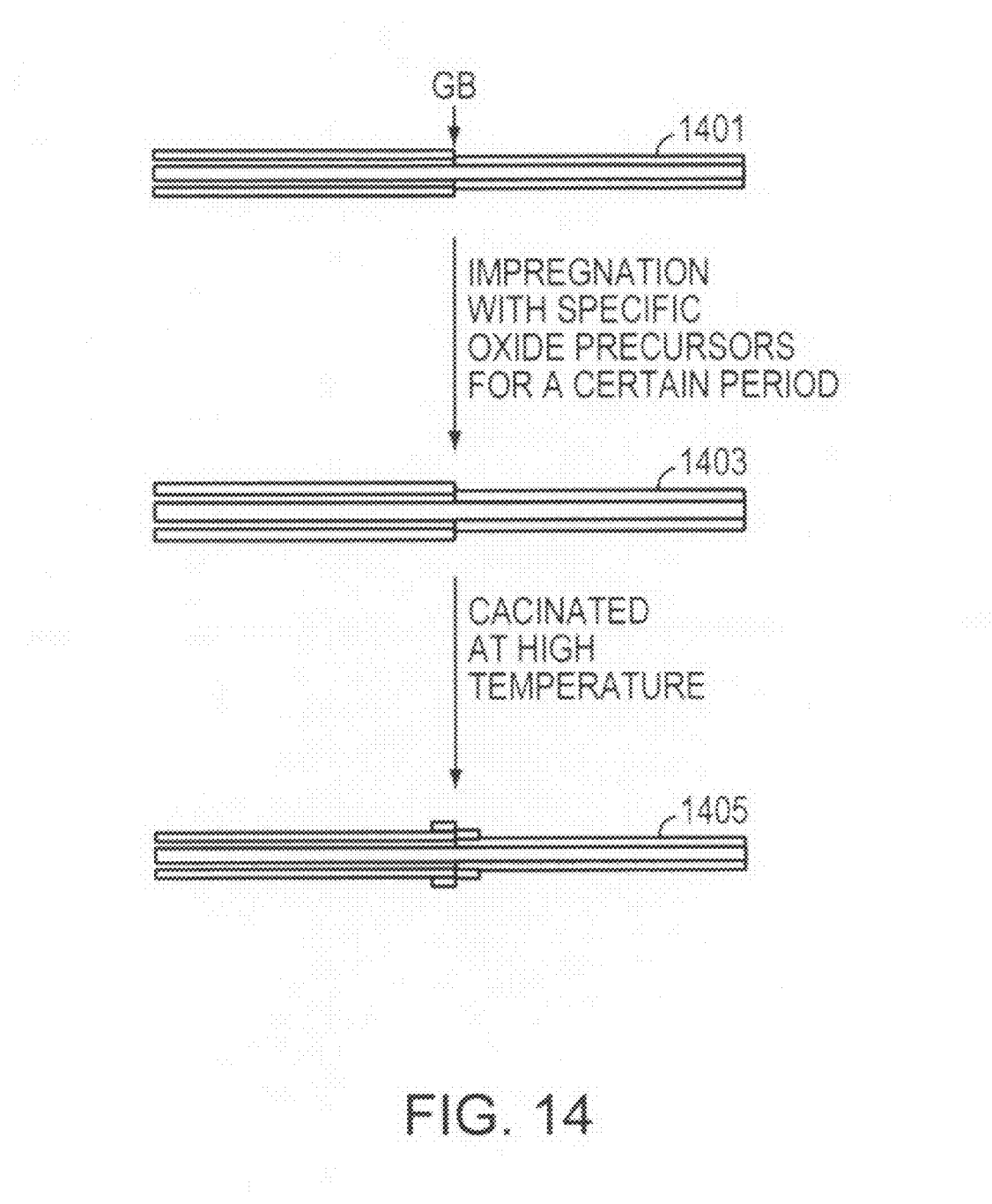
FIG. 14 is an overview schematic of a localized doping process, which may be used for building an electrostatic potential barrier in the junction region.

FIG. 14 illustrates an overview of the impregnation process. Firstly as-grown linear homogeneous multi-grain boundary junction nanowire (e.g., nanowire 1401) may be immersed into PH-controlled dissimilar metal oxide precursors for a period of time 1403. Thus, it ensures a sufficient amount of impurity ions to be transferred to the grain-boundary regions and a sufficient amount of precursor coating on top of the nanowires. Then the junction nanowire may be removed from the precursor solution and treated via a high temperature calcination process 1405. In this process, the majority of impurity oxide may diffuse into the grain boundary region allowing for localized doping across nanoscale grain boundaries. By building such an impurity layer across the gain boundaries, a periodic electrostatic potential array can be constructed to meet the needs of electronic applications of different voltage-level.

In example embodiments, the ZnO nanowires may be grown in solution using a synthetic chemistry approach, such as the hydrothermal or solvothermal synthesis discussed above. As was noted previously, by controlling reaction conditions such as temperature, concentration, pH value, reaction time, and plastic-substrate surface quality, nanowires of different density distributions, dimensionality, grain boundaries, and alignment may be fabricated.

FIGS. 15A and 15B illustrate low resolution and magnified, respectively, SEM images depicting sparsely grown ZnO nanowire arrays on a plastic substrate. The nanowires illustrated have a density of ca. 1 $\mu m^{-2}$ cm on a Au-coated plastic substrate. The nanowires are typically 100-350 nm wide and ca. 1 $\mu m$ long. The SEM image shown in the inset of FIG. 15B is a side view of the nanowires aligned perpendicularly to the plastic substrate.

FIG. 15C is a schematic depicting an experimental setup used for measuring the mechanically induced piezoelectric discharge from individual nanowires. A conductive Si tip 1501 coated with a Pt film with a cone angle of 70° was used for AFM measurements. The rectangular cantilever 1503 had a calibrated normal spring constant of 1.857 $Nm^{-1}$. In the AFM contact mode, a constant normal force of 5 nN was maintained between the tip and sample surface. When the tip was scanned over the top of the ZnO nanowires, the tip height was adjusted according to the surface morphology and local contacting force. For the electric contact at the bottom of the nanowires, Ag paste was applied to connect the Au film on the plastic substrate surface to the measurement circuit. Connecting Ag and ZnO produces an Ohmic contact. The output voltage across an external load of resistance $R_L$=500 MΩ was continuously monitored as the tip was scanned over the nanowires. In contact mode, as the tip was scanned over the vertically aligned nanowires, the nanowires were bent consecutively. The tip forced the elastic deflection of the oriented ZnO nanowires and produced a charge separation and a voltage drop across the diameter of the nanowires, with the stretched and compressed sides having positive and negative piezoelectric potentials, respectively. The center axis of the nanowire, as indicated by the dotted line, remained neutral.

As the conductive tip was scanned across the neutral axis, a discharge occurred when the tip touched the compressed side of the nanowire. A single nanowire that has a diameter of 300 nm can produce an output voltage discharge of ca. 45 mV (FIG. 15D), which is the voltage drop across an external resistor converted using the measured electrical current. In fact, the true output voltage should be higher if the inner resistance of the nanowire is considered.

FIG. 15D is a typical voltage output for an AFM tip scanning over a single nanowire. Because of the limited scan speed of the AFM tip in comparison to the discharge time, only two data points were captured around the peak area, which suggests that the true peak could be twice as large as the measured 45 mV shown in this profile.

The scanning speed of the AFM tip was 53.51 $\mu ms^{-1}$, and the full width at half maximum (FWHM) of the peak in FIG. 15D is 234 nm. Therefore, the lifetime decay constant of the circuit shown in FIG. 15C is estimated to be $\tau_c$=4.4 ms, based on the equation $\tau_c=(R_L+R_{nw})C_{nw}$, where $R_L$ and $R_{nw}$ are the resistances for the external load (500 MΩ) and the ZnO nanowire, respectively, and $C_{nw}$ is the capacitance of the nanowire and the measurement system. As previously reported, $R_{nw}$ may be negligible in comparison to the external load; thus, the capacitance of the nanowire can be calculated by $C_{nw} \approx \tau_c/R_L$. The output piezoelectric energy, Wo, for a single pulse is $Wo=\frac{1}{2}C_{nw}V_p^2=\tau_cVp^2/2R_L=8.9\times10^{-15}$ J, where $V_p$ is the peak voltage. Here $W_o$ only represents the harvested electrical energy from the first half cycle of the nanowire resonance that results from a single touch of the tip to the nanowire.

Power was calculated based on the average energy generated within the resonance lifetime, and it was assumed that the energy generated for half of the resonance cycles was collected. In this case, the individual nanowires are typically 300 nm in diameter, exhibit a hexagonal cross section, and are ca. 1 μm in length. According to mechanical vibration theory, the first harmonic resonance frequency of the nanowire can be calculated to be ca. 70 MHz; considering the damping effect in air, the lifetime of a single nanowire may be ca. 50 μs. Therefore, the effective number of cycles required for energy harvesting is about 3500. By considering the decay of the vibration amplitude of a nanowire for the subsequent resonance, the output power of a single nanowire may be 10-20 pW.

FIG. 15E is a 3D plot of a topographic AFM scan of a 40 μm×40 μm area of the ZnO nanowire array. The scanning direction is from the front to the back, which can be seen from the raised linear traces on the flexible plastic substrate. Because of the flexibility of the plastic substrate, and in spite of the firm adhesion to the Ag paste, the substrate surface profile under tip contact was somewhat wavy. Relative to the plastic substrate, the nanowire array was revealed to have a height distribution of 0.5-2.0 μm.

FIG. 15F illustrates the corresponding 3D plot of the voltage output image. There are a number of sharp peaks ranging from 15 to 25 mV that represent voltage outputs. By counting the pulse numbers shown here with respect to the number of nanowires in the topography profile in FIG. 15E, the ratio of voltage peaks to the number of available nanowires is 90:150 or about 60%, which suggests that the discharge events of the nanowires captured by the AFM tip correspond to at least 50% of the nanowires. Because of the limitation in the data-collecting speed of the atomic force microscope, which has a data step size of ca. 156.2 nm in this measurement, the discharge peaks of some nanowires were missed, possibly due to poor contact between the tip and the nanowires and/or due to multiple contacts with neighboring nanowires. It is suggested that both suitable bonding strength between the ZnO nanowires and the polymer substrate and a uniform density distribution of nanowires in the array might be very important in terms of improving the piezoelectric discharge efficiency. These two issues, together with the power output calculations, will be explored in the following discussions.

To calculate the total number of nanowires that effectively produced electrical energy output, an average voltage peak height of ca. 20 mV is assumed, and the density of ZnO nanowires on the plastic substrate was very conservatively estimated to be 1 μm$^{-2}$. The power density per unit substrate area is ca. 1-2 pWμm$^{-2}$, that is, 0.1-0.2 mWcm$^{-2}$, which is large enough to power a variety of devices that operate at lower power consumption, such as microelectromechanical systems (MEMS), nanoelectromechanical systems (NEMS), and other nanoscale devices.

Figure 16:
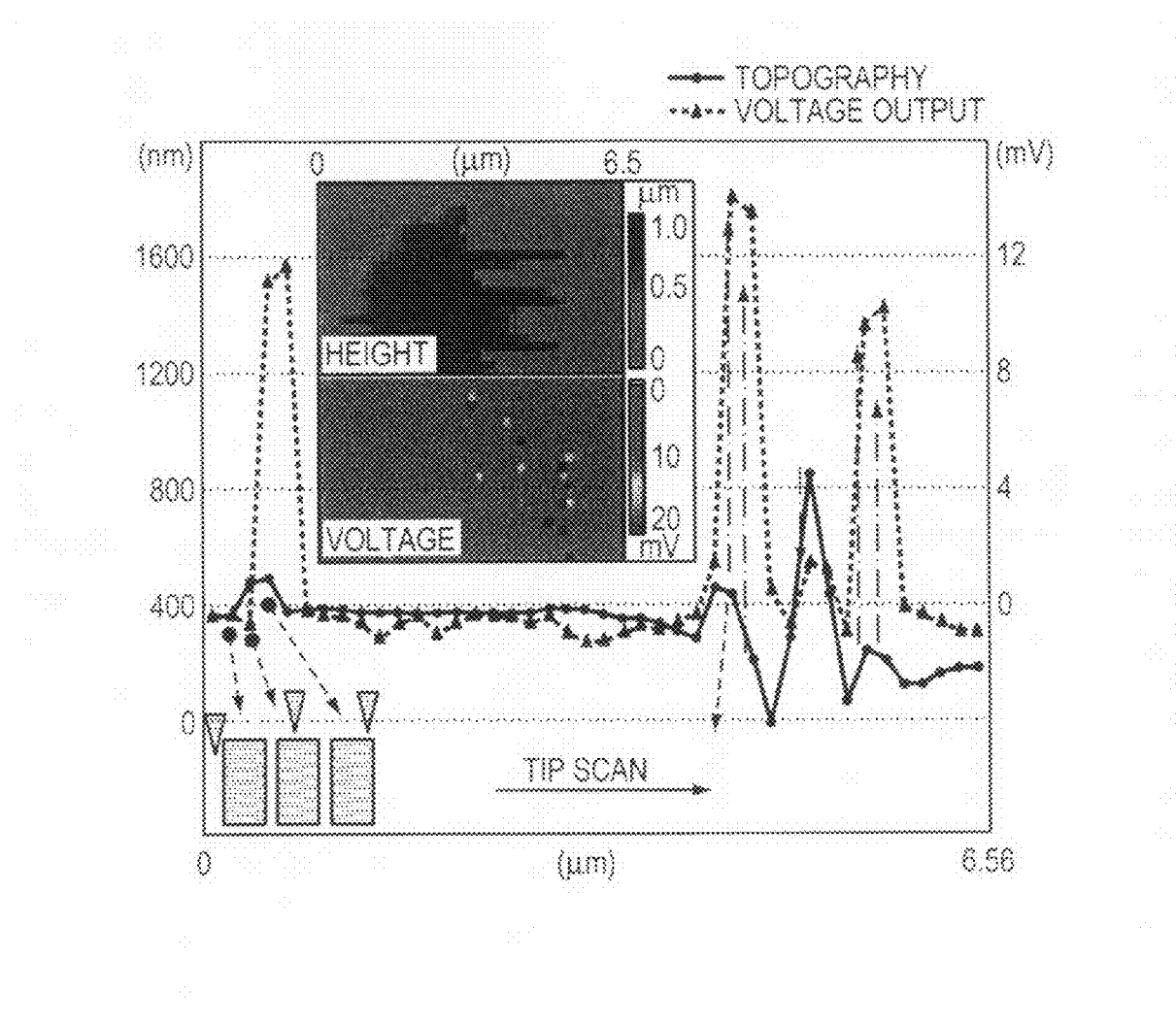
FIG. 16 is a graphical representation of a recorded line scanning topography image and voltage output profile of several aligned ZnO nanowires.

FIG. 16 displays simultaneously the recorded scanning height topography (blue line) and voltage-output profile (pink line) for a line scan of the AFM tip across a ZnO nanowire array. In the scanning range of 6.56 μm, at least four nanowires have been contacted based on the topography profile. As registered with the topography profile, the corresponding voltage-output profile also shows four peaks of heights 12, 15, 2, and 10 mV. In each case, the voltage-output peak begins to increase when the AFM tip touches the flat cross section of the nanowire, and the voltage peak reaches its maximum when the AFM tip reaches the side edge of the top flat cross section of the nanowire. When the AFM tip starts to cross the central axial line of the nanowire, the voltage discharge begins, which occurs between two data points corresponding to the center of the discharge peak. When the tip completely releases the nanowire tip, the discharge is determined by the characteristics of the external circuit. The delay in the voltage peak in reference to the topography profile is entirely consistent with the mechanism presented previously.

The inset in FIG. 16 displays the 2D AFM topography image and the corresponding voltage/current output image recorded simultaneously when the AFM tip scans over a 6.5 μm×3.2 μm area. The height profile in the top image indicates that the local density of the nanowires is so large that the AFM tip could not resolve them individually because of the tip size effect; thus, only the surrounding nanowire edges could be resolved. The corresponding voltage-output profile reveals that the red dots are distributed only at the extreme righthand side, indicating that the discharge occurs at the end of the tip scan over the nanowires. In this case, the high local density of the nanowire array prevented the deflection event from achieving completion without multiple contacts. Therefore, a reasonable nanowire density distribution that matches with the tip size and scanning speed may be needed for improving the voltage-output number.

Figure 17:
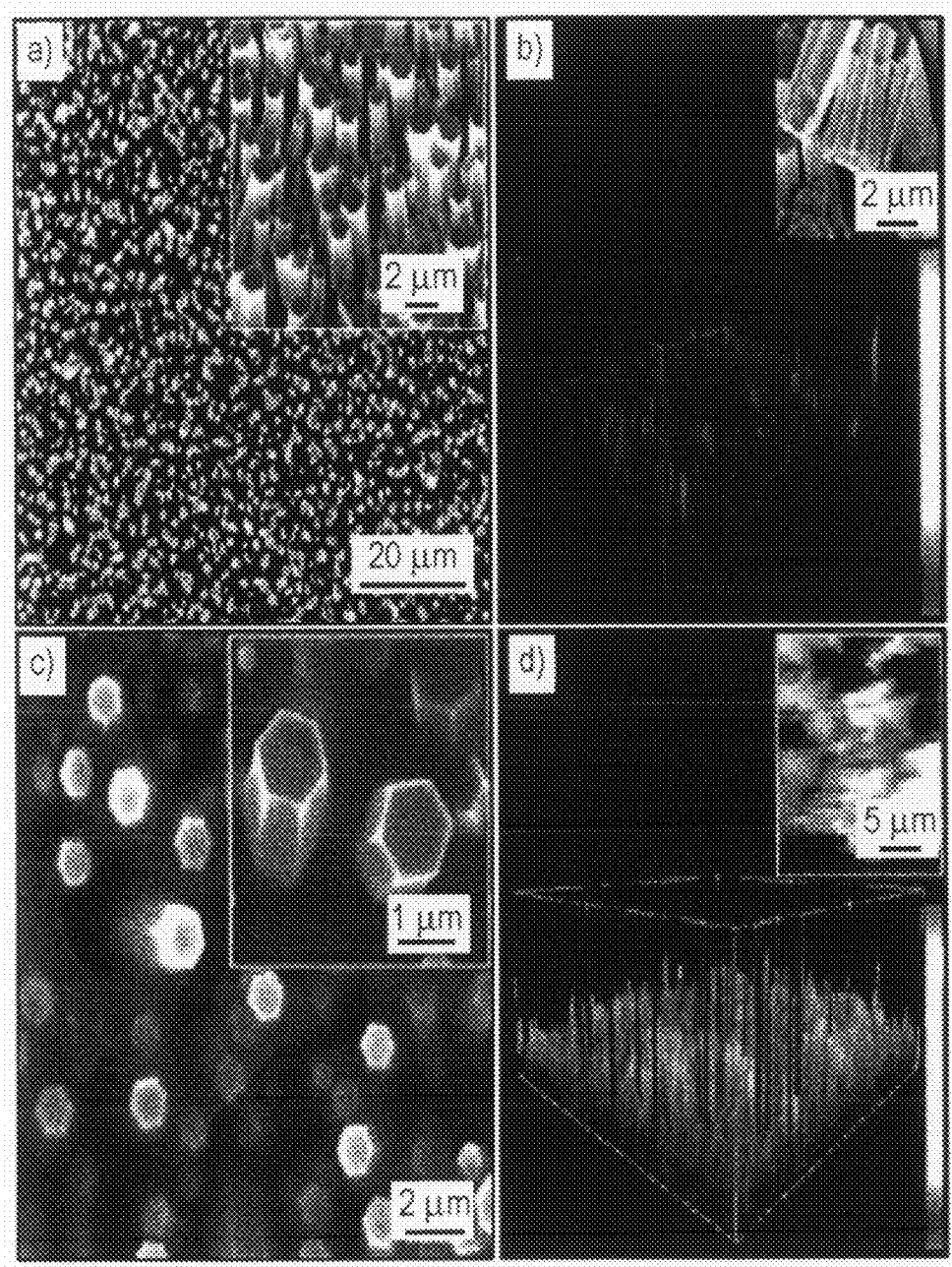
FIGS. 17A and 17B are SEM images of a top down view of a ZnO microwave array and a corresponding AFM voltage output profile, respectively.
FIGS. 17C and 17D are SEM images of a top-down view of ZnO wires immersed in a Polymethylmethacrylate (PMMA) coating and a corresponding AFM voltage output profile form AFM measurements, respectively.
Figure 18:
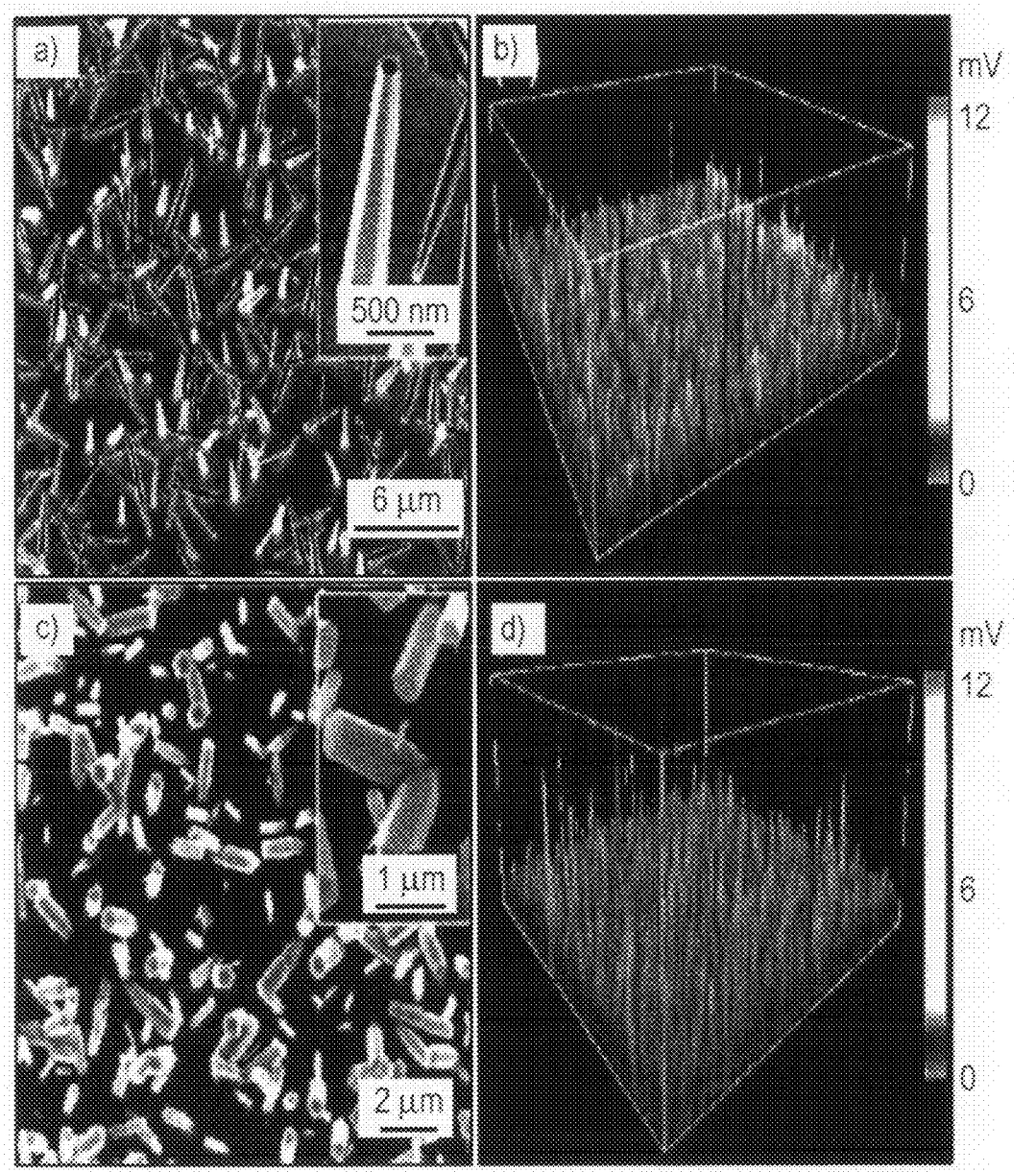
FIGS. 18A and 18B is a SEM image of a ZnO nanocone set and a corresponding AFM voltage output profile, respectively.
FIGS. 18C and 18D is a SEM image of a top-down view of a randomly oriented ZnO nanowire array and a corresponding AFM voltage output profile, respectively.

It should be appreciated that nanowires grown on a polymer substrate with diameters of 300 nm and lengths of 1 μm may give rise to an output power of ca. 5 pW at 45 mV. To evaluate the power-generating capability of ZnO nanowire arrays grown on plastic substrates, nanowire arrays configured differently in terms of dimensions and orientation have been tested to demonstrate the performance of the nanogenerator, and these arrays are shown in FIGS. 17 and 18.

Figure 15:
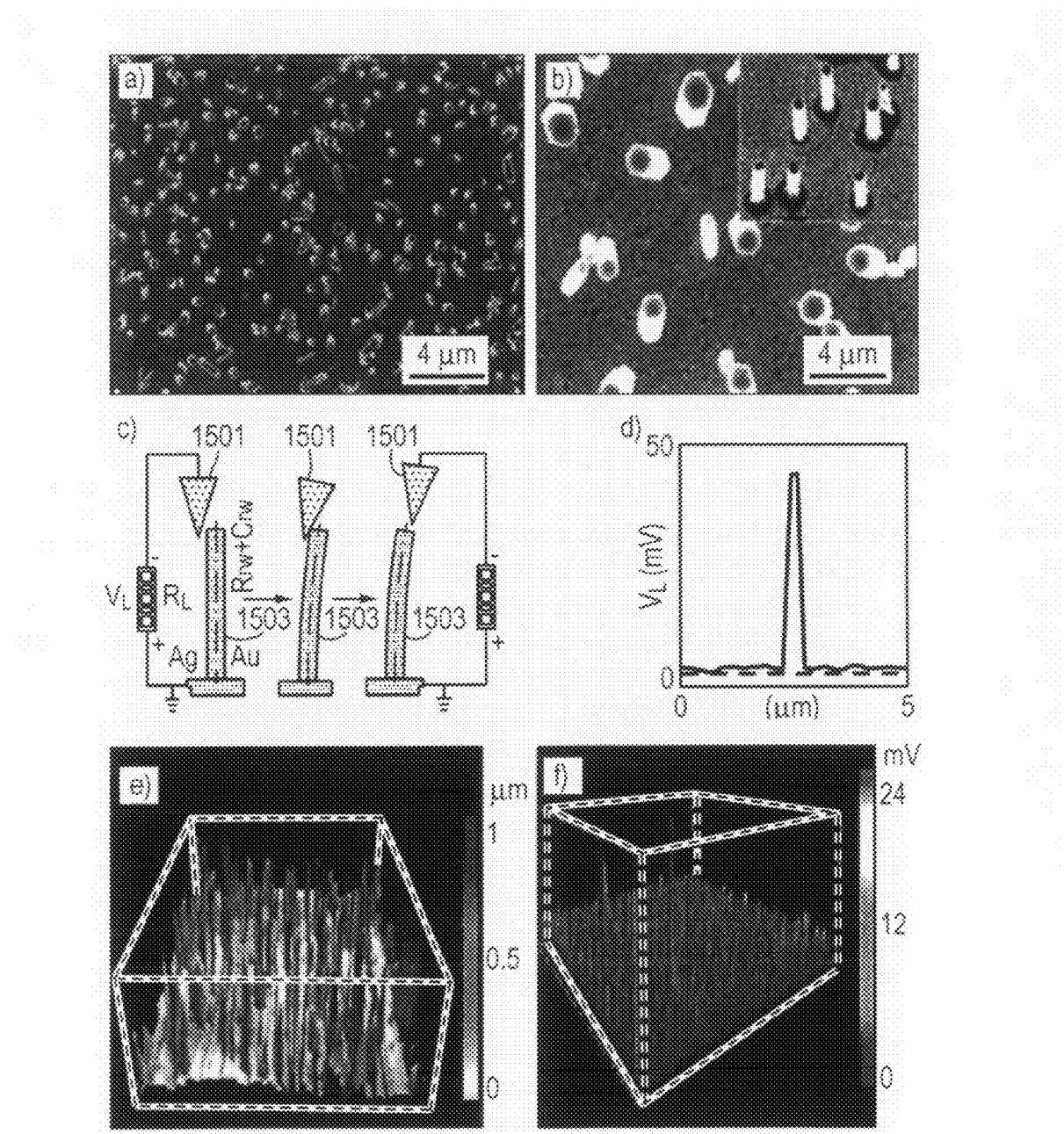
FIGS. 15A and 15B are low-magnification and higher-resolution, respectively, SEM images of a zinc oxide (ZnO) nanowire.
FIG. 15C is a schematic of an experimental set up used to obtained FIGS. 15A, 15B, and 15D-15F.
FIGS. 15D-15F are a voltage output profile for an atomic force microscope (AFM) tip scanning, a 3D plot of the AFM topography image, and a voltage output profile obtained by scanning the AFM tip over an area of aligned ZnO nanowires, respectively.

FIG. 17A illustrates a top down view of an as-grown, densely packed, vertically aligned ZnO microwire array on a plastic substrate. The microwires are uniform with a width of 1-2 μm and a height of 5-10 μm. The SEM image in the inset is a side-on view of the aligned wire array, which reveals a good vertical alignment on the plastic substrate. The microwires are separated by 0.1-1 μm. The substrate surface area covered by the wires is 50-80% (the surface coverage in the case of FIG. 15 is only ca. 10%). Under the conductive AFM test, using the same test parameters as those used for the system in FIG. 15, we found that the voltage discharge events may occur less frequently than for the sparsely aligned nanowires, simply indicating that a densely packed nanowire array may not be the optimum choice for enhancing the power output of nanogenerators.

FIG. 17B illustrates the corresponding 3D plot of the voltage image for an area of size 20 μm×20 μm. As shown, only a few (approximately ca. 10) sharp voltage peaks emerge out of the noise level, suggesting that the small normal tip force (5 nN) may not be sufficiently strong to deflect the ZnO microwires. To find out why only a few peaks were detected in the AFM scan in an area that has at least 50 wires, the tested sample was examined by using SEM. After tip scanning, only a few wires were left standing upright on the substrate; most of the wires in the array were pushed down by the AFM tip, as shown in the SEM image in the inset. Several possible reasons may account for this result.

First, the adhesion between the Au-coated base and the ZnO microwires could be so weak that it cannot bear the force applied by the AFM tip. The second reason could be that the microwire may be too strong to be elastically deformed; once it is pushed by the AFM tip, it tends to be displaced owing to a weak connection to the substrate rather than elastic deformation. Finally, the density of the wires could be so high that there may not much room for the wires to be deflected by the AFM tip without touching neighboring wires; thus, the piezoelectric current, if any, may slowly leak out, resulting in a gradual discharge signal.

To improve the bonding between the wires and the substrate, a poly(methyl methacrylate) (PMMA) coating approximately 200 nm thick was introduced on the substrate after wire growth.

FIG. 17C shows the ZnO microwire array on a plastic substrate after the PMMA coating. The bottom portion of the wire array has been encapsulated by the PMMA coating (as shown in the inset). The top portion of the wire array is clean after 10 min of UV irradiation following a spincoating and soft-baking process. In FIG. 17C, the shorter wires have been buried by the PMMA coating, while most of the long microwires are standing on the surface.

FIG. 17D illustrates the result from AFM measurements. The number of voltage peaks in an area of 20 μm×20 μm has increased to ca. 50. The peak voltage output amplitude remains in the range of 6-12 mV. The inset is an AFM topography image of the corresponding microwire array affixed by PMMA. The microwires are firmly held onto the plastic substrate during the tip scan, as shown in the topography image, suggesting that by using a reinforcing layer of polymer coating, the nanowires/substrate connection can be significantly improved.

To determine the effect of nanowire shape and orientation on power generation, cone-shaped ZnO nanowires and randomly oriented ZnO nanowires on plastic substrates were grown and used for AFM measurements.

FIG. 18A shows as-grown, cone-shaped ZnO hexagonal nanowires with ca. 50% vertical alignment on a plastic substrate. The nanocones typically have tip diameters of 100-200 nm, base diameters of 300-500 nm, and lengths of 3-5 μm (inset). Under the conductive tip deflection, only a few voltage output peaks in the range of 6-12 mV are observed (FIG. 18B).

FIG. 18C illustrates a typical SEM image of the as-grown ZnO nanowires oriented randomly on the plastic substrate. The SEM image in the inset reveals the tilted hexagonal nanowires rooted at the plastic substrate with dimensions of 200-600 nm in width and 1-2 μm in length.

FIG. 18D illustrates AFM measurement results revealing an increased number of voltage output peaks of 6-12 mV. The results suggest that as long as there is a way to bend the wires, a voltage/current signal is likely to be generated no matter what kind of orientation the wires adopt with respect to the plastic substrate. This result offers another advantage to energy harvesting utilizing large-scale nanowire arrays made by using solution based chemistry.

The lead zirconium titania (PZT) ceramic is the most typical ceramic material for piezoelectric applications, and it has been used for producing output voltage. In comparison to PZT, a nanowire array grown on a polymer substrate has a number of advantages for generating electricity. First, the nanowire-based nanogenerators can be subjected to extremely large deformations, both on the nanowires and the substrate, indicating that they can be used for flexible electronics as flexible/foldable power sources. Second, the large degree of deformation that the nanowires can bear is likely to afford a much larger volume density of power output. Third, in contrast to PZT, ZnO is a biocompatible, "biosafe" material, suggesting that it has a greater potential for use as an implantable power source in the human body. Fourth, the flexibility of the polymer substrate used for growing ZnO nanowires makes it feasible to accommodate the flexibility of human muscles so that we can use the mechanical energy (body movement, muscle stretching) in the human body to generate electricity. Finally, ZnO nanowire nanogenerators can directly produce current because of their enhanced conductivity in the presence of oxygen vacancies.

Thus, in example embodiments, when localized doping is realized in a linear ZnO nanoparticle (nanowire) junction, a back-to-back Schottky potential profile may be modulated by external stress in nanoscale grain boundaries, which can be driven by external fields such as E (electrical field), B (magnetic field), T (thermal field).

Figure 19:
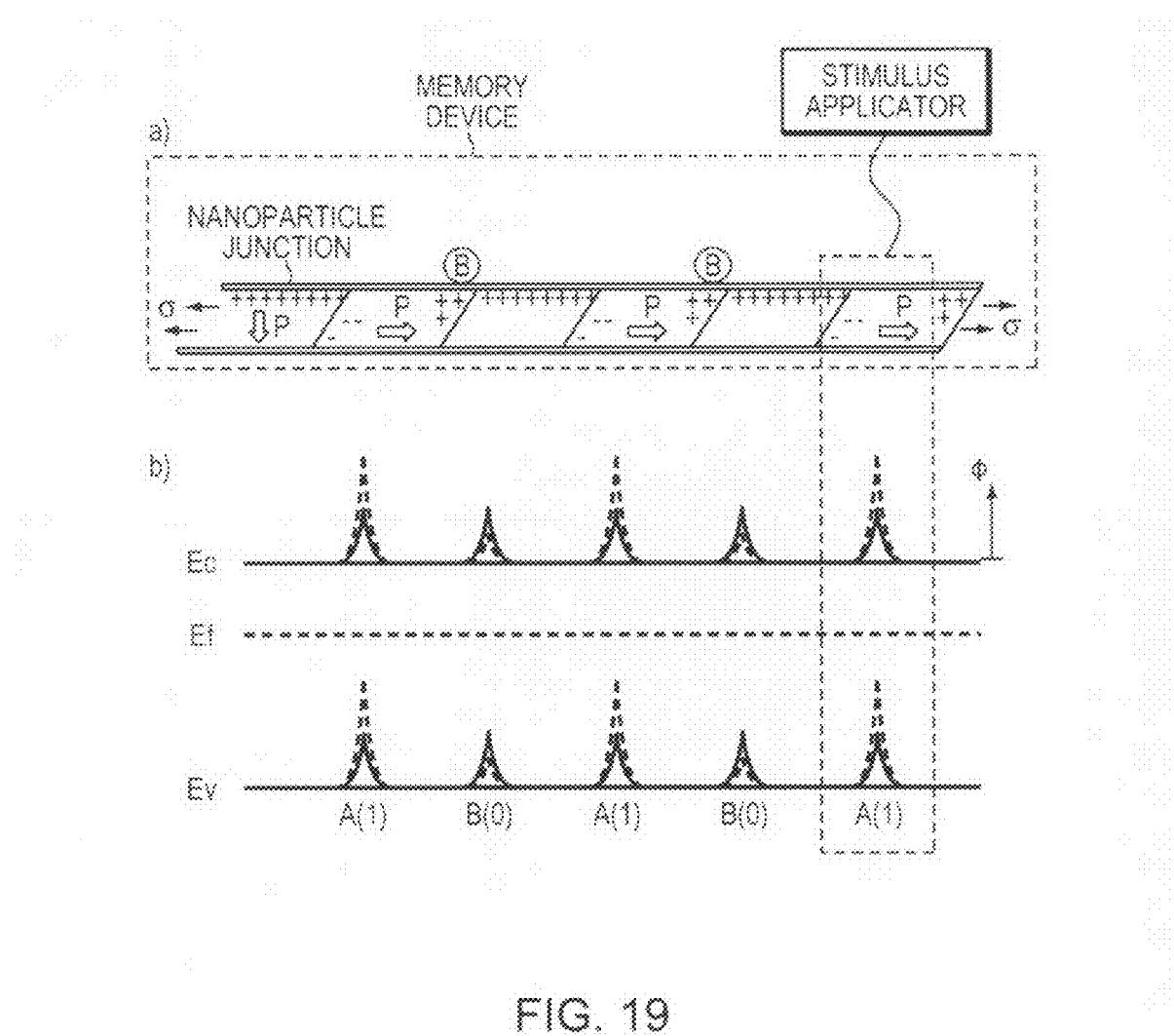
FIG. 19 is a schematic of nanoscale memory and its potential barrier profile.

FIG. 19 illustrates an example of a memory device according to example embodiments. A stimulus applicator may be used to apply a stimulus to the nanoparticle junctions (a) of the memory device. In the current example, the stimulus is a stress or strain field, although it should be appreciated the stimulus may also be in the form of an electric, magnetic, of temperature stress field. The combination of external and internal stresses induced by external field such as strain field would lead to periodical electrostatic potential modulation coding such as A(1)-B(0)-A(1)-B(0)-A(1) due to the charge redistribution induced by the piezoelectric effect and elastic deformation.

The modulated nanoparticle (nanowire) junctions in ZnO can be extended to a variety of semiconductors, transition metal oxides and perovskites such as ZnO, ZnS, ZnSe, CdSe, CdS, CdTe, AlN, GaN, CdO, $Ga_2O_3$, CuO, NiO, $WO_3$, $Fe_2O_3$, $In_2O_3$, SnO, $SnO_2$, $TiO_2$, $MeTiO_3$ (Me=Ba, Ca, Mg, Pb, Sr, Zr, etc.), $ZnSnO_3$, $Zn_2SnO_4$, $Zn_2GaO_4$, $LaMeO_3$ (Me=Fe, Mn, Cr, Co, Zn, Cu, Ni, etc.) $SrMnO_3$, $CaMnO_3$, $KNbO_3$, $LiNbO_3$, Mg $(NbO_3)_2$, InN, etc. It would be a big family of new nanoscale materials which can be used as nanoscale varistors, nanoscale memories and even nanosensors upon the selective functionalization on the modulated nanoparticle surfaces.

Figure 20:
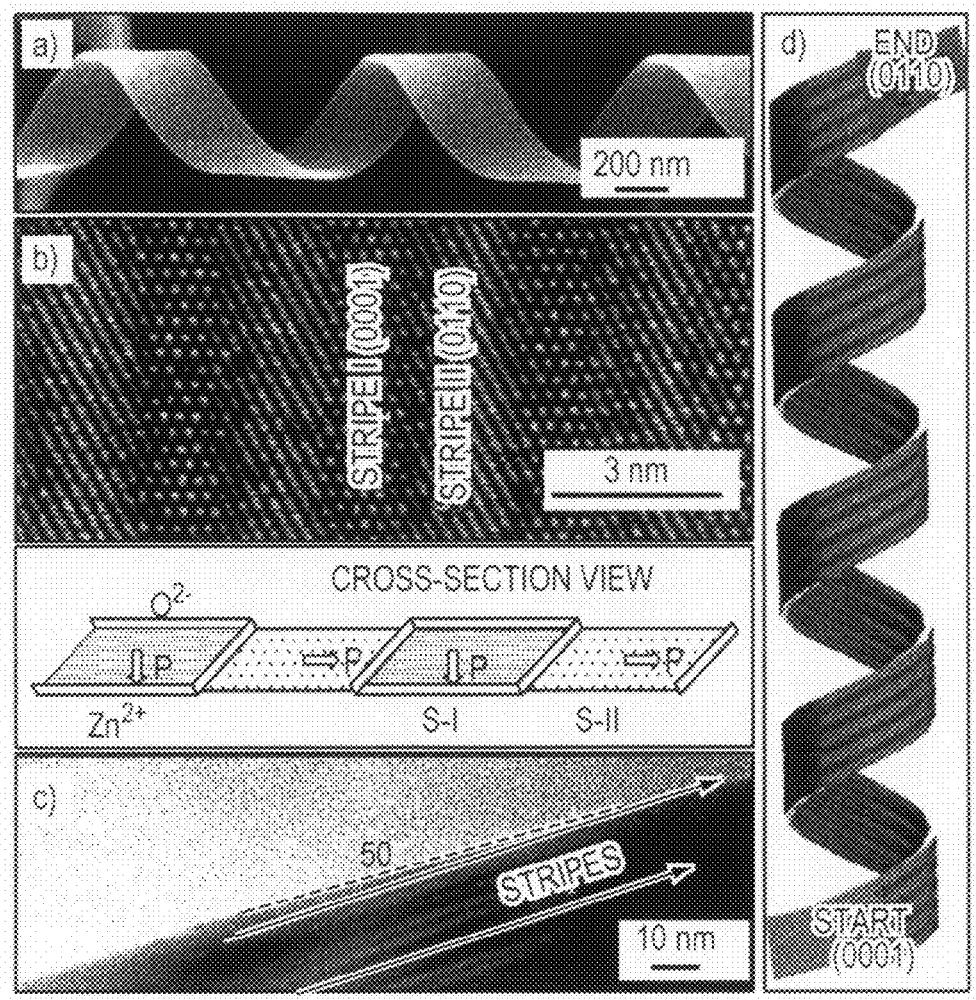
FIG. 20A is a scanning electron microscopy (SEM) image of a right-handed nanohelix superlattice.
FIG. 20B is a zoomed in image of the SEM image of FIG. 20A illustrating two alternative strips of the nanohelix.
FIG. 20C is a dark-field transmission electron microscopy (TEM) image of the nanohelix illustrated in FIG. 20A.
FIG. 20D is a schematic of the nanohelix of FIG. 20A.

Nanohelix:

It should be appreciated that a junction may further be controlled with the use of a nanohelix. FIG. 20A illustrates an scanning electron microscope (SEM) image of a right-handed nanohelix superlattice. A nanohelix is a nanostructure that resembles the helical configuration of a DNA strand. Overall, the nanohelix may be characterized as a periodic, coherent, epitaxial, and parallel assembly of two alternating stripes (S-I and S-II) including oxide nanocrystals orientated with their respective c-axes perpendicular to each other, as shown in FIG. 20B. In an example embodiment, each nanocrystal stripe may have a width of ~1.8 nm, defining a period of ~3.5 nm. The nanocrystal stripes S-I and S-II may include top and bottom surfaces of ±(0001) polar surfaces and ±(0110) non-polar surfaces. The nanohelix may be approximately 300-800 nm in diameter, ~10-30 nm thick, ~100-160 nm wide, and an observed length within the range of ~1-500 μm.

To fabricate the three-dimensional nanohelix devices, photolithography (PL), electron-beam lithography (EBL), focused ion beam (FIB) lithography, together with standard etching and deposition technologies may be used. In example embodiments, a distinctive helical structure made of a superlattice-structured nanobelt may be formed.

As an illustrative example, a ZnO nanohelix may be formed spontaneously in a solid-vapor growth process by using temperature to control growth kinetics. An experimental setup may include a horizontal high-temperature tube furnace, an alumina tube, a rotary pump system, and a gas-controlling system. First, 2 g of commercial ZnO powder (e.g., Alfa Aesar, Ward Hill, Mass.) is compacted, loaded into an alumina boat, and positioned at the center of the alumina tube as the source material. The system is prepumped to ~2×10$^{-2}$ mbar, and the ramp rate is controlled at 20° C./min to 25° C./min when the temperature is raised from room temperature to 800° C. The furnace is then held at 800° C. for 20 minutes, and the temperature is ramped at 20° C./min from 800° C. to 1400° C. When the temperature reaches 1000° C., argon is introduced as a carrier gas to raise the pressure from ~2×10$^{-2}$ mbar to the desired synthesis pressure of 200 to 250 mbar within ~2.5 min. The solid-vapor deposition is carried out at 1400° C. for ~2 hours under a pressure of 200 to 250 mbar. The argon carrier gas is kept at a flow rate of 50 sccm (standard cubic centimeters per minute). The as-grown nanohelices of ZnO are deposited onto a polycrystalline Al$_2$O$_3$ substrate at a local temperature of 700° C. to 800° C.

FIG. 20C is a dark-field transmission electron microscopy (TEM) image. It should be appreciated that with a ~5° offset shown in the dark-field TEM image of FIG. 20C, the nanostripes are nearly parallel to the nanobelt growth direction and run along the length of the superlattice nanohelix. The nanohelix growth starts with a structural transformation from a single-crystal ±(0001) dominated nanobelt into a (01$\bar{1}$0)/(0001) superlattice nanohelix, and then is terminated with a transformation into a ±{01$\bar{1}$0} dominated single-crystal nanobelt, as shown in FIG. 20D. It should be appreciated that reducing the polar-surfaces may be the driving force for forming the superlattice structure, and the rigid structural rotation/twisting caused by the superlattice results in the initiation and formation of the nanohelix.

Figure 21:
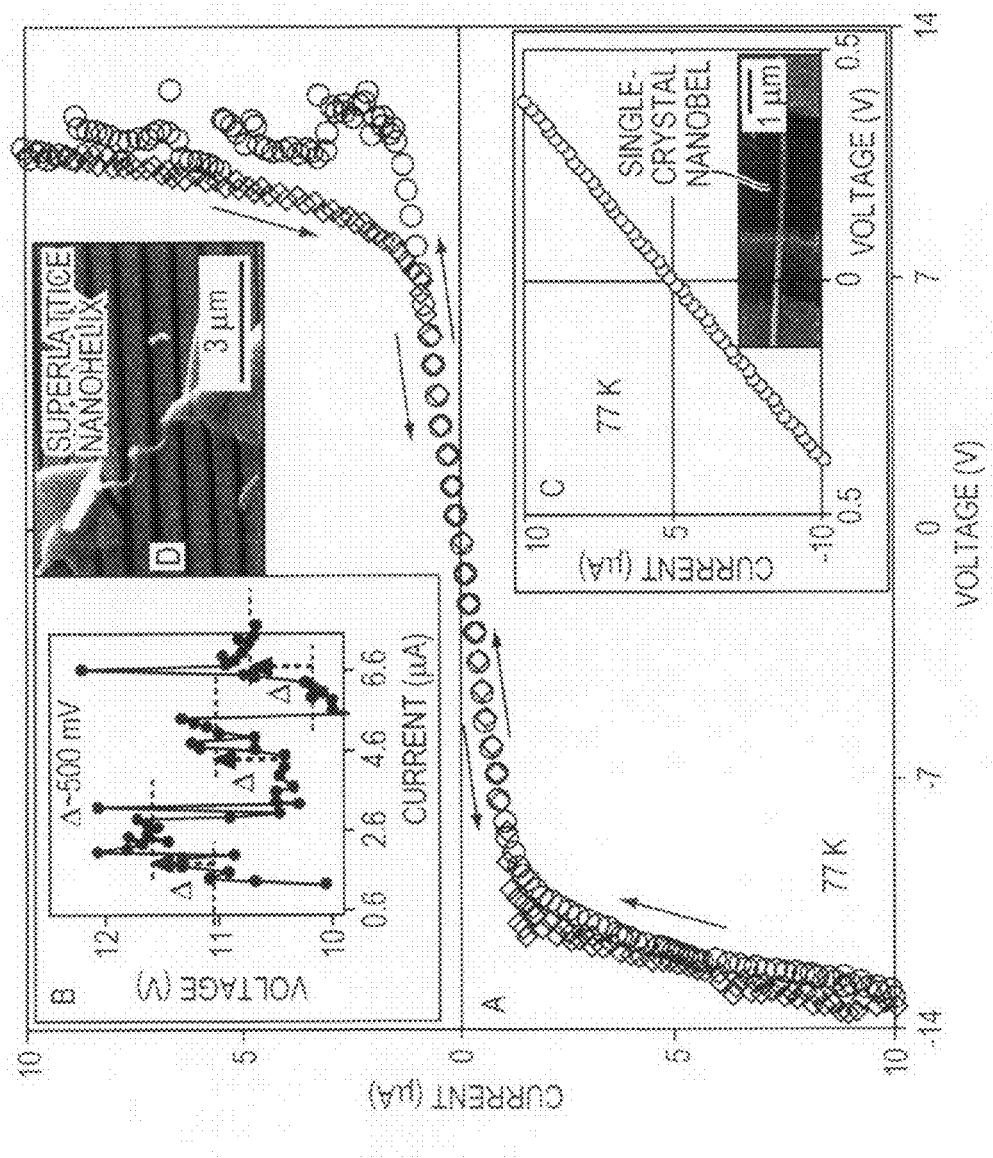
FIG. 21A is a graphical illustration of non-linear I-V characteristics of an ~4 μm long nanohelix superlattice measured at 77 k in a vacuum.
FIG. 21B is a graphical illustration of experimental results of the nanohelix of FIG. 21A and a nanobelt depicting jumping steps in voltage when the current is swept.
FIG. 21C is an illustration of the transport property of a single crystal ZnO nanobelt.

Electrically, in comparison to the Ohmic transport property of a single crystal ZnO nanobelt (as shown in FIG. 21C) measured under the same experimental conditions, a symmetric "Schottky-type" current-voltage (I-V) property of the nanohelix described above (and illustrated in FIG. 21D) was observed. In FIG. 21A, a pair of typical 77 K current-voltage curves shown a large current forward and reverse sweeping in a range of ±10 μA on a nanohelix (~4 μm in length, ~180 nm in width, ~20 nm in thickness, and ~400 nm in diameter) device. Both forward and reverse sweepings give rise to consistent low field (less than 1.8 MV/m) linear I-V characteristics, with a resistance of ~8.6 MΩ. While at a high field above 1.8 MV/m, it is found that the I-V curve becomes highly non-linear. The forward sweeping at forward high field led to a regular voltage oscillation with an amplitude of ~500 mV, as shown in FIG. 21B. The reverse sweeping at the reverse high field has shown a similar phenomenon but not as significant as the forward high field in the forward sweeping case. It is worth noting that at room temperature, no such a voltage oscillation occurred. Therefore, a resonant tunneling of electrons at high field might happen with the large thermionic electron emission being suppressed at low temperature. The non-linear I-V characteristic for the nanohelix is likely due to the intrinsic structure of the nanohelices, by involving a periodically built-in electrostatic potential barrier across interfaces.

To break down, the non-linear I-V transport property of the nanohelix may be explained by considering the electrical potential introduced by polar charges from ZnO {0001} planes and other polar surfaces as well as the stress induced piezoelectric field across oriented nanostripes. These factors might lead to significant electron depletion and trapping to modify the potential barrier profile, which therefore could form periodic back-to-back (double) Schottky barriers across the ZnO nanostripe boundaries, similar to that in the doped ZnO polycrystalline varistors involving thin insulating oxide layers around successive ZnO grains.

Therefore, even without doping, the nanoscale grain boundary modulation can be facilitated by anisotropic surface electronic potential modulation, which may potentially induce significant functional modulation as well as the doped nano-grain boundaries, leading to a varistor-like behavior.

It should be appreciated that similar to the nanoparticle (or nanowires) described above, the ZnO nanohelix structure may also be extended to a variety of semiconductors, transition metal oxides and perovskites such as ZnO, ZnS, ZnSe, CdSe, CdS, CdTe, AlN, GaN, CdO, Ga$_2$O$_3$, CuO, NiO, WO$_3$, Fe$_2$O$_3$, In$_2$O$_3$, SnO, SnO$_2$, TiO$_2$, MeTiO$_3$ (Me=Ba, Ca, Mg, Pb, Sr, Zr, etc.), ZnSnO$_3$, Zn$_2$SnO$_4$, Zn$_2$GaO$_4$, LaMeO$_3$ (Me=Fe, Mn, Cr, Co, Zn, Cu, Ni, etc.) SrMnO$_3$, CaMnO$_3$, KNbO$_3$, LiNbO$_3$, Mg (NbO$_3$)$_2$, InN, etc. This type of homogeneous multi-crystal periodic junctions could be potentially realized as well using the solution chemistry methods including hydrothermal or solvothermal approaches.

In summary, a miniaturized and nanoscale varistor, as well as other electrical components, may be provided via a sequential two-step or multi-step rational synthesis strategy. Furthermore, the linear or nonlinear nanoparticle (nanowire) junctions with local boundary chemical modulation represent a controllable device design unlike the average hulk sintering process. By tuning the number of grain boundaries and chemical modulation (doping) across grain boundaries, a complete family of nanoscale varistors, and other electronic devices, with a large tunable range of break-down voltage and index of nonliearity can be designed and fabricated using the example embodiments discussed to meet the requirement of high power electronics, low-voltage microelectronics and nanoelectronics. By engineering the linear or nonlinear array of nanoscale grain boundaries with local doping, external field induced electrostatic potential modulation with a special coding of high (1) and low (0) can be utilized for nanoscale memory application as well. The applied materials can be extended to a large group of highly anisotropic semiconductor, piezoelectric, ferroelectric and thermoelectric materials.

While this invention has been particularly shown and described with references to example embodiments thereof, it will be understood by those skilled in the art that various changes in form and details may be made therein without departing from the scope of the invention encompassed by the appended claims.

What is claimed is:

1. An electronic device comprising:
   multiple nanoparticles including a tuned number of grain boundaries; and
   a junction including the multiple nanoparticles defining a tunable electric potential of the junction, wherein the junction is selected from a group consisting of: (i) a linear or nonlinear junction including homogenous grain boundaries, and (ii) a heterojunction.

2. An electronic device comprising:
   multiple nanoparticles including a tuned number of grain boundaries; and
   a junction including the multiple nanoparticles defining a tunable electric potential of the junction, wherein the junction is configured to have its electric potential tuned by at least one of the following: introduction of localized impurities into the grain boundaries, incorporation of anisotropic surface potentials across pure grain boundaries, application of an external electric field, application of an external magnetic field, application of an external temperature field, application of an external stress field, or configured as a back-to-back Schottky potential barrier.

3. A method of manufacturing a semiconductor or functional oxide junction, the method comprising:
   fabricating multiple nanoparticles;
   tuning a number of grain boundaries of the multiple nanoparticles; and
   implanting the multiple nanoparticles in a semiconductor or functional oxide junction, the multiple nanoparticles defining a tunable electric potential of the junction, wherein the junction is selected from a group consisting of: (i) a linear or nonlinear junction including homogenous grain boundaries, and (ii) a heterojunction.

4. A method of manufacturing a semiconductor or functional oxide junction, the method comprising:
fabricating multiple nanoparticles;
tuning a number of grain boundaries of the multiple nanoparticles by varying at least one fabrication parameter non-uniformly during fabrication; and
implanting the multiple nanoparticles in a semiconductor or functional oxide junction, the multiple nanoparticles defining a tunable electric potential of the junction.

5. The method of claim 4 wherein the at least one fabrication parameter is pressure or temperature, or concentration, or solvent.

6. A method of manufacturing a semiconductor or functional oxide junction, the method comprising:
fabricating multiple nanoparticles;
tuning a number of grain boundaries of the multiple nanoparticles;
implanting the multiple nanoparticles in a semiconductor or functional oxide junction, the multiple nanoparticles defining a tunable electric potential of the junction; and
doping the grain boundaries with localized impurities.

7. The method of claim 6 further including providing the doping with an impregnation process or with a dip pen atomic force microscope.

8. A method of manufacturing a semiconductor or functional oxide junction, the method comprising:
fabricating multiple nanoparticles;
tuning a number of grain boundaries of the multiple nanoparticles;
implanting the multiple nanoparticles in a semiconductor or functional oxide junction, the multiple nanoparticles defining a tunable electric potential of the junction; and
tuning the electrical potential with at least one of the following: an external electric field, incorporating anisotropic surface potentials across pure grain boundaries, applying an external magnetic field, applying an external temperature field, or applying an external stress field.

9. A semiconductor or functional oxide device comprising:
a tunable junction including nanoparticles, at least a subset of the nanoparticles including a tuned number of grain boundaries, said nanoparticles produced by the process of:
(a) mixing a solution of chemical precursors in different solvents;
(b) heating the solution while varying operational parameters non-uniformly to tune the number of grain boundaries of the nanowires; and
(c) doping the grain boundaries with localized impurities.

10. The device of claim 9 wherein the operational parameters include temperature, or pressure.

11. The device of claim 9 wherein the doping includes impregnating the grain boundaries with the localized impurities, or providing the localized impurities with a localized dip pen atomic force microscope.

12. The device of claim 9 wherein the nanoparticles are fabricated from a group of materials consisting of ZnO, ZnS, ZnSe, CdSe, CdS, CdTe, AN, GaN, CdO, $Ga_2O_3$, CuO, NiO, $WO_3$, $Fe_2O_3$, $In_2O_3$, SnO, $SnO_2$, $TiO_2$, $MeTiO_3$ (Me=Ba, Ca, Mg, Pb, Sr, Zr, etc.), $ZnSnO_3$, $Zn_2SnO_4$, $Zn_2GaO_4$, $LaMeO_3$ (Me=Fe, Mn, Cr, Co, Zn, Cu, Ni, etc.) $SrMnO_3$, $CaMnO_3$, $KNbO_3$, $LiNbO_3$, $Mg(NbO_3)_2$, InN.

* * * * *

UNITED STATES PATENT AND TRADEMARK OFFICE
CERTIFICATE OF CORRECTION

PATENT NO. : 8,350,252 B2
APPLICATION NO. : 12/404036
DATED : January 8, 2013
INVENTOR(S) : Pu-Xian Gao It is certified that error appears in the above-identified patent and that said Letters Patent is hereby corrected as shown below:

In Column 20, Claim 12, Line 26: Please delete "AN", and insert -- AlN --.

Signed and Sealed this
Twelfth Day of March, 2013

Teresa Stanek Rea
*Acting Director of the United States Patent and Trademark Office*